(12) United States Patent
Yamazaki et al.

(10) Patent No.: US 9,647,125 B2
(45) Date of Patent: May 9, 2017

(54) SEMICONDUCTOR DEVICE AND METHOD FOR MANUFACTURING THE SAME

(71) Applicant: Semiconductor Energy Laboratory Co., Ltd., Kanagawa-ken (JP)

(72) Inventors: Shunpei Yamazaki, Tokyo (JP); Tetsuhiro Tanaka, Kanagawa (JP); Hideki Uochi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 44 days.

(21) Appl. No.: 14/280,625

(22) Filed: May 18, 2014

(65) Prior Publication Data
US 2014/0339549 A1   Nov. 20, 2014

(30) Foreign Application Priority Data

May 20, 2013   (JP) ................... 2013-106421

(51) Int. Cl.
*H01L 29/10* (2006.01)
*H01L 29/786* (2006.01)
*H01L 27/12* (2006.01)

(52) U.S. Cl.
CPC ...... *H01L 29/7869* (2013.01); *H01L 27/1255* (2013.01); *H01L 29/78648* (2013.01); *H01L 29/78696* (2013.01)

(58) Field of Classification Search
CPC ........... H01L 29/7869; H01L 29/78696; H01L 29/78648; H01L 27/1255
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,635,526 B1 | 10/2003 | Malik et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Kim, K., "Technology for Sub-50nm DRAM and NAND Flash Manufacturing," IEDM 05: Technical Digest of International Electron Devices Meeting, Dec. 5, 2005, pp. 333-336.

(Continued)

*Primary Examiner* — Su C Kim
(74) *Attorney, Agent, or Firm* — Husch Blackwell LLP

(57) ABSTRACT

A first trench and a second trench are formed in an insulating layer, a transistor including an oxide semiconductor layer in the first trench is formed, and a capacitor is formed along the second trench. A first gate electrode is formed over the first trench, and a second gate electrode is formed under the first trench.

22 Claims, 21 Drawing Sheets

(56) References Cited

U.S. PATENT DOCUMENTS

| | | | |
|---|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,795,096 B2 | 9/2010 | Wang |
| 7,846,826 B2 | 12/2010 | Oyu et al. |
| 8,164,138 B2 | 4/2012 | Lee |
| 8,384,080 B2 | 2/2013 | Taniguchi et al. |
| 8,669,550 B2 | 3/2014 | Akimoto et al. |
| 8,692,252 B2 | 4/2014 | Takata et al. |
| 8,766,255 B2 | 7/2014 | Isobe et al. |
| 8,957,418 B2 * | 2/2015 | Moriguchi | H01L 27/1225 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0232408 A1 | 11/2004 | Heeger et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0084255 A1 | 4/2006 | Oyu et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278540 A1 | 12/2007 | Hoshino et al. |
| 2007/0287296 A1 | 12/2007 | Chang |
| 2007/0296031 A1 | 12/2007 | Tanaka |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0256237 A1 | 10/2009 | Kobayashi |
| 2009/0278122 A1 | 11/2009 | Hosono et al. |
| 2009/0280600 A1 | 11/2009 | Hosono et al. |
| 2009/0315138 A1 | 12/2009 | Chang et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0159639 A1 | 6/2010 | Sakata |
| 2011/0012118 A1* | 1/2011 | Yamazaki | H01L 27/1225 257/59 |
| 2012/0025304 A1 | 2/2012 | Blank et al. |
| 2012/0032163 A1* | 2/2012 | Yamazaki | H01L 21/02554 257/43 |
| 2012/0187410 A1 | 7/2012 | Yamazaki et al. |
| 2012/0187417 A1 | 7/2012 | Yamazaki et al. |
| 2012/0187475 A1 | 7/2012 | Yamazaki et al. |
| 2012/0223306 A1 | 9/2012 | Saito et al. |
| 2012/0223310 A1 | 9/2012 | Noda et al. |
| 2012/0235150 A1 | 9/2012 | Isobe et al. |
| 2014/0339546 A1 | 11/2014 | Yamazaki et al. |
| 2014/0339548 A1 | 11/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-273934 | * 12/2010 |
| JP | 2011-124360 A | 6/2011 |
| JP | 2011-138934 A | 7/2011 |
| WO | WO-2004/114391 | 12/2004 |
| WO | WO2012/077682 | * 6/2012 |

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(56) References Cited

OTHER PUBLICATIONS

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temerature", Appl. Phys. Lett. (Applied Physics Letters) , Sep. 27, 2007, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of The SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Paper, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Application", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—Bo Systems [A; Fe, Ga, Or Al; B: Mg, Mn, Fe, Ni, Cu,Or Zn] at Temperature Over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probe using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector with Suppressed Voltage Loss for White Tadem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs with a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Appled Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42,3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display with Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceeding of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

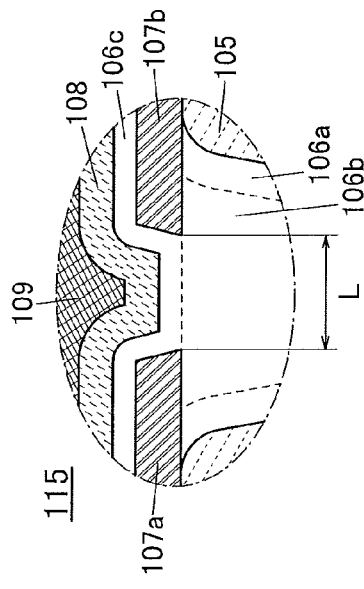
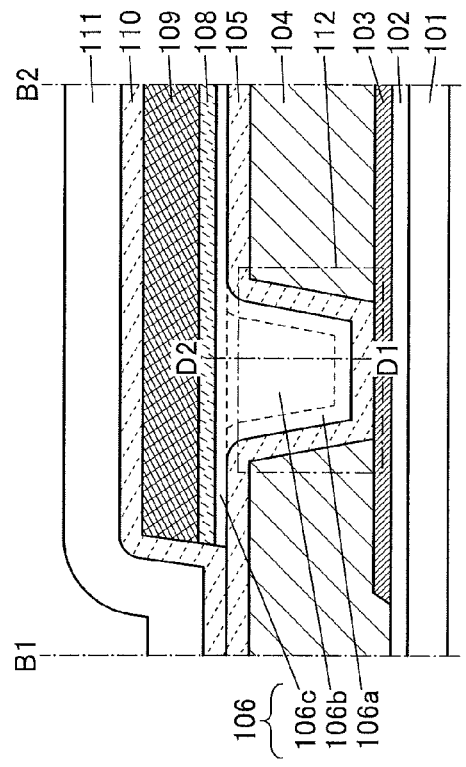
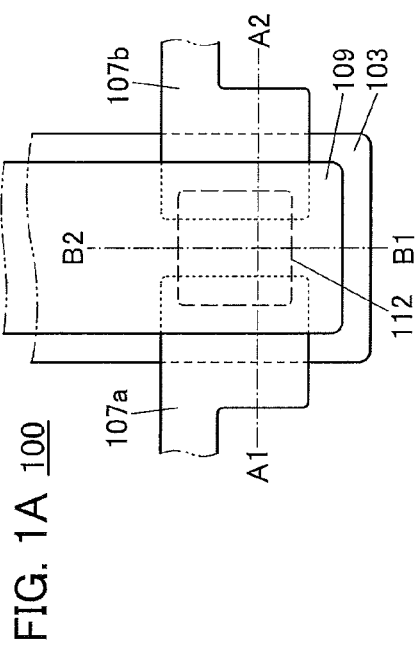
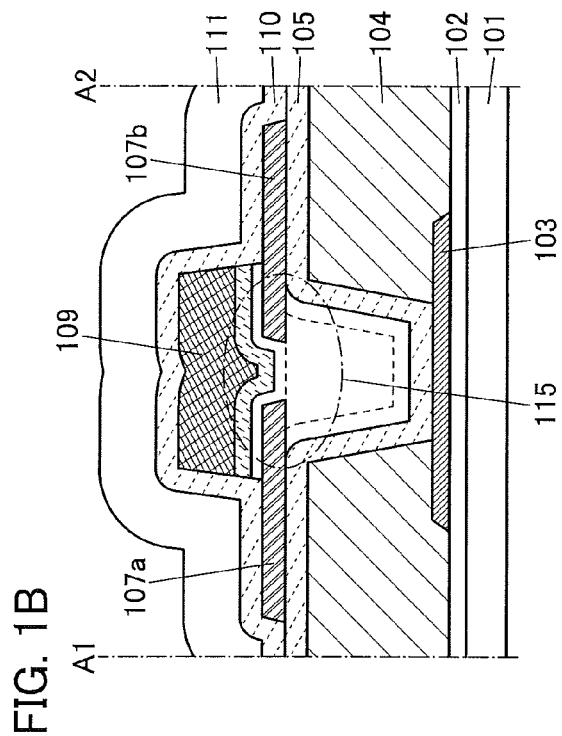

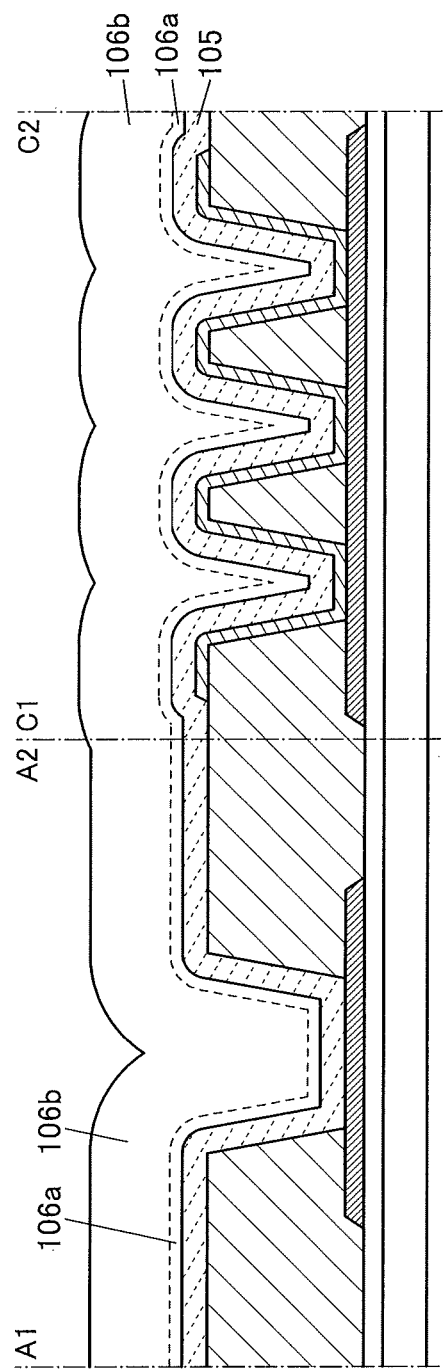
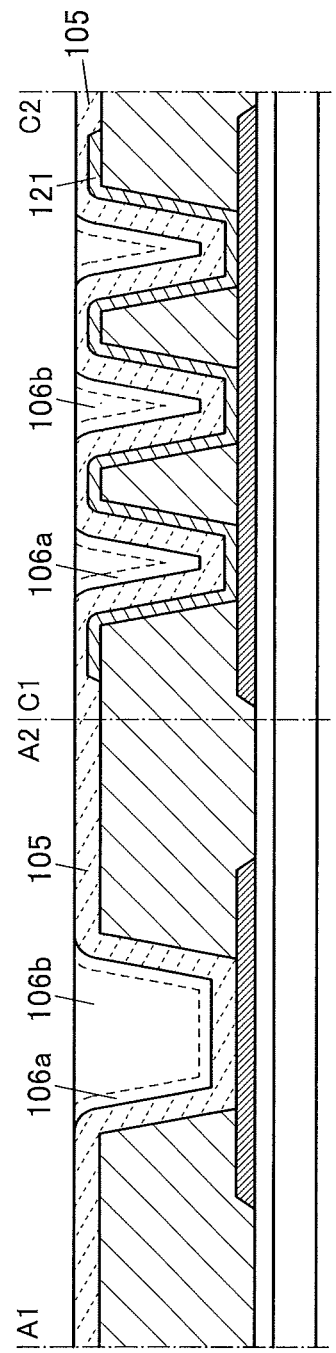
FIG. 4A
FIG. 4B

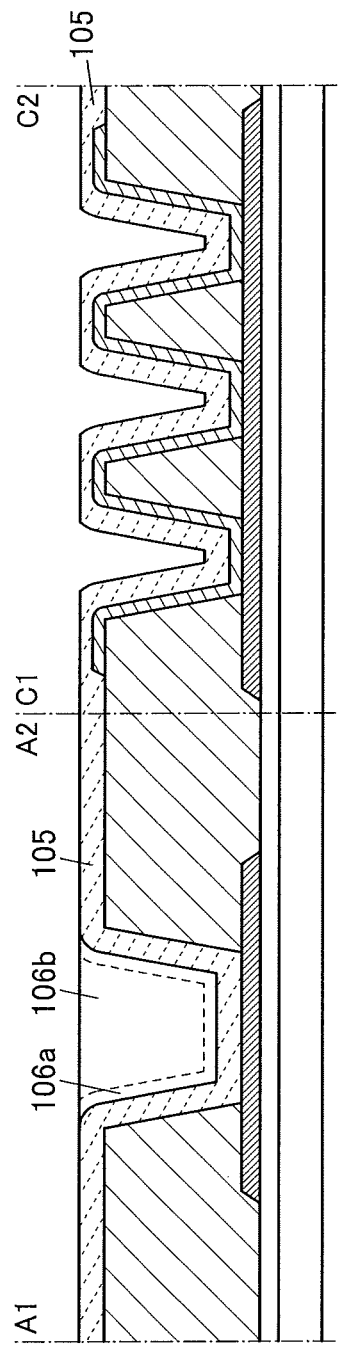
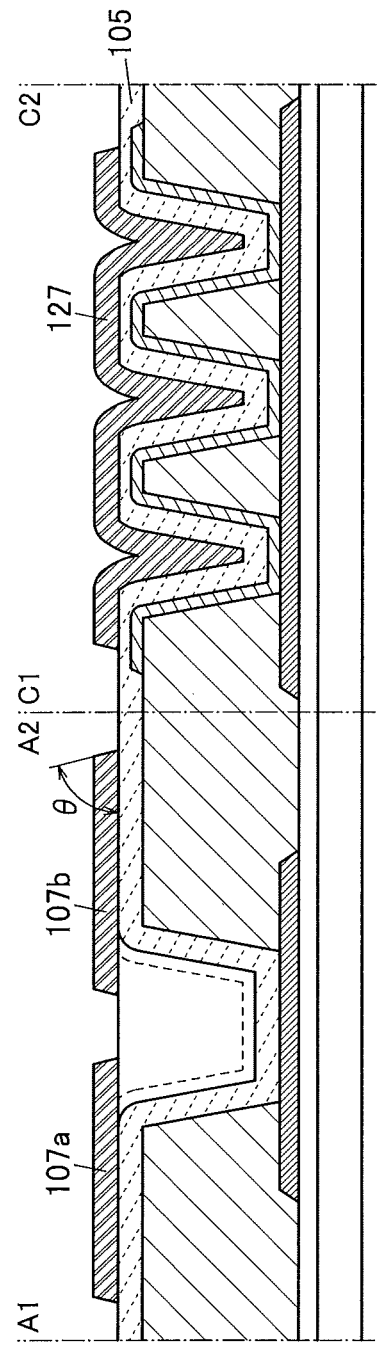
FIG. 5A
FIG. 5B

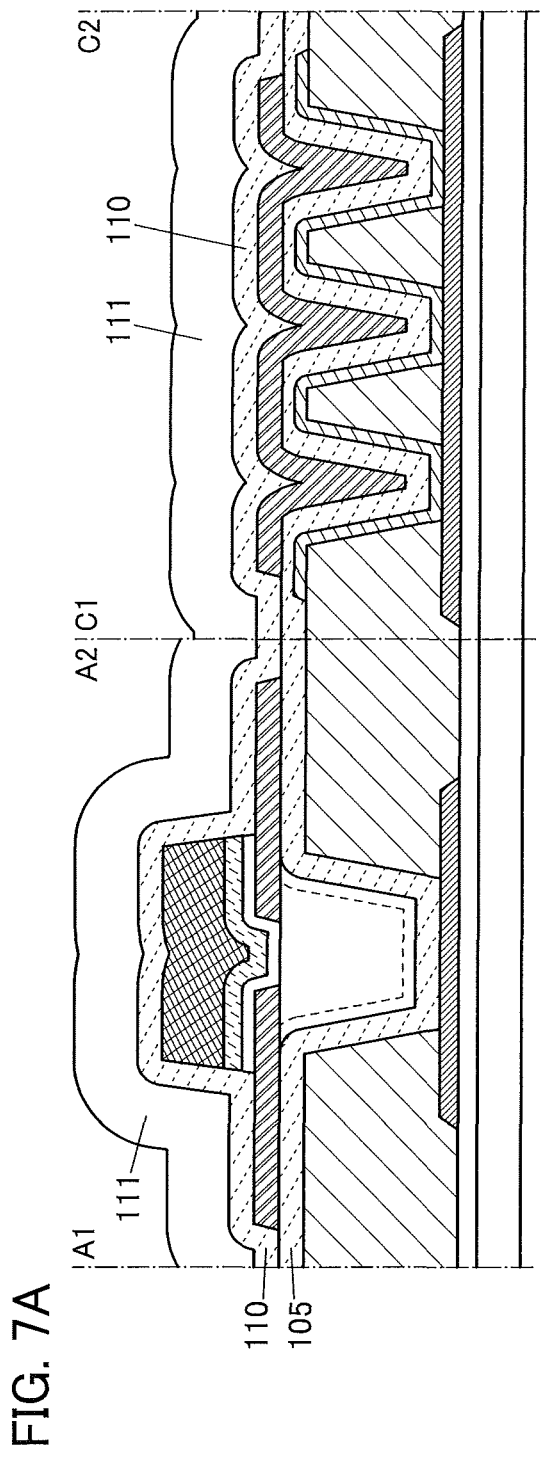
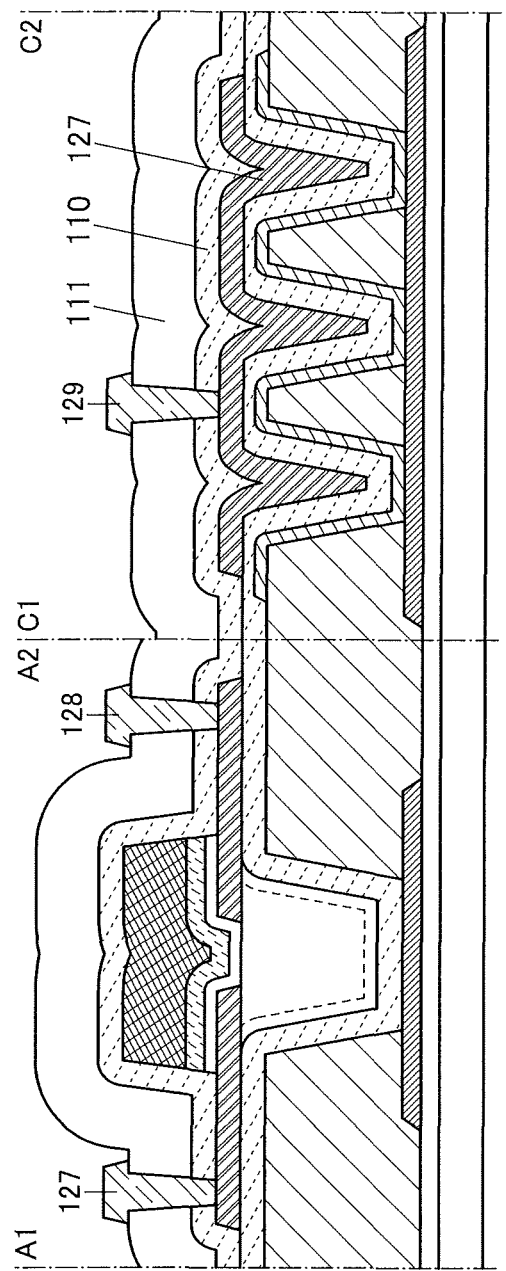
FIG. 7A
FIG. 7B

SEMICONDUCTOR DEVICE AND METHOD FOR MANUFACTURING THE SAME

BACKGROUND OF THE INVENTION

1. Field of the Invention

One embodiment of the present invention relates to a semiconductor device and a method for manufacturing the semiconductor device.

Note that in this specification, a semiconductor device generally means a device which can function by utilizing semiconductor characteristics. An electrooptic device, a light-emitting display device, a semiconductor circuit, and an electronic device are all semiconductor devices.

2. Description of the Related Art

A technique in which a transistor is formed using a semiconductor thin film has attracted attention. The transistor is applied to a wide range of electronic devices such as an integrated circuit (IC) or an image display device (also simply referred to as a display device). A silicon-based semiconductor material is widely known as a material for a semiconductor thin film applicable to a transistor. As another material, an oxide semiconductor has attracted attention.

For example, a technique is disclosed by which a transistor is formed using zinc oxide or an In—Ga—Zn-based oxide as an oxide semiconductor (see Patent Documents 1 and 2).

In addition, a technique in which oxide semiconductor layers with different electron affinities (or conduction band minimum states) are stacked to increase the carrier mobility of a transistor is disclosed (see Patent Documents 3 and 4).

In recent years, demand for an integrated circuit in which transistors and the like are integrated with high density has risen with reductions in the size and weight of an electronic device.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-124360
[Patent Document 4] Japanese Published Patent Application No. 2011-138934

SUMMARY OF THE INVENTION

One object of one embodiment of the present invention is to provide a semiconductor device with favorable electrical characteristics and a method for manufacturing the semiconductor device.

Another object of one embodiment of the present invention is to provide a semiconductor device which can be miniaturized or highly integrated and a method for manufacturing the semiconductor device.

Another object of one embodiment of the present invention is to provide a novel semiconductor device and a method for manufacturing the semiconductor device.

One embodiment of the present invention is a semiconductor device including a transistor, a capacitor, and an insulating layer. The insulating layer includes a first trench and a second trench. The transistor includes a semiconductor layer, and at least part of the semiconductor layer is formed inside the first trench. At least part of the capacitor is formed inside the second trench.

The transistor includes a first electrode, a second electrode, a third electrode, a fourth electrode, a first insulating layer, a second insulating layer, and a third insulating layer. The semiconductor layer includes a first oxide semiconductor layer, a second oxide semiconductor layer, and a third oxide semiconductor layer. The first trench overlaps the first electrode, and at least part of the first insulating layer is formed to be adjacent to side surfaces and a bottom surface of the first trench. At least part of the first oxide semiconductor layer is adjacent to the side surfaces and the bottom surface of the first trench with the first insulating layer provided therebetween, and at least part of the second oxide semiconductor layer is formed inside the first trench and in contact with at least part of the first oxide semiconductor layer. The second electrode and the third electrode are formed over the first insulating layer and in contact with part of the second oxide semiconductor layer; the third oxide semiconductor layer is formed over the second electrode and the third electrode and in contact with part of the second oxide semiconductor layer; the second insulating layer is formed over the third oxide semiconductor layer; the fourth electrode is formed over the second insulating layer; and the third insulating layer is formed over the fourth electrode.

In the semiconductor device of one embodiment of the present invention, the electron affinity of the first oxide semiconductor layer and the electron affinity of the third oxide semiconductor layer are smaller than the electron affinity of the second oxide semiconductor layer.

The first oxide semiconductor layer, the second oxide semiconductor layer, and the third oxide semiconductor layer preferably contain In, Ga, or Zn. The first oxide semiconductor layer and the third oxide semiconductor layer preferably contain the same metal element of one or more kinds of metal elements contained in the second oxide semiconductor layer.

The first insulating layer and the third insulating layer are formed using a material having a high impurity barrier property, whereby diffusion of impurities from the outside to the oxide semiconductor layer can be prevented. Moreover, the third insulating layer is in contact with the first insulating layer in the peripheral portion of the transistor, whereby diffusion of impurities from the outside to the oxide semiconductor layer can be further prevented. As the material having a high impurity barrier property, aluminum oxide can be used, for example.

The capacitor can be formed by forming a fifth electrode along side surfaces and a bottom surface of the second trench and overlapping a sixth electrode with the fifth electrode with the fourth insulating layer provided therebetween.

According to one embodiment of the present invention, a semiconductor device with favorable electrical characteristics and a method for manufacturing the semiconductor device can be provided.

According to one embodiment of the present invention, a semiconductor device which can be miniaturized or highly integrated and a method for manufacturing the semiconductor device can be provided.

According to one embodiment of the present invention, a novel semiconductor device and a method for manufacturing the semiconductor device can be provided.

BRIEF DESCRIPTION OF THE DRAWINGS

In the accompanying drawings:

FIGS. 1A to 1D illustrate a structural example of a transistor;

FIGS. 4A and 4B illustrate steps of manufacturing a semiconductor device;

FIGS. 5A and 5B illustrate steps of manufacturing a semiconductor device;

FIGS. 7A and 7B illustrate steps of manufacturing a semiconductor device;

DETAILED DESCRIPTION OF THE INVENTION

Figure 2A:
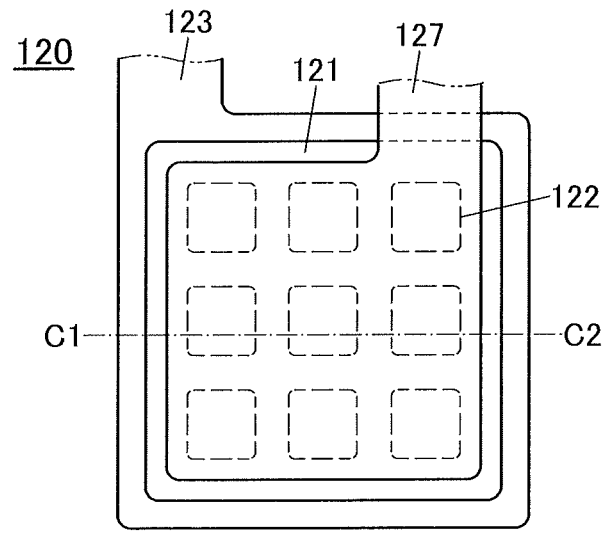
FIGS. 2A and 2B illustrate a structure example of a capacitor.

Embodiments will be described in detail with reference to drawings. Note that the present invention is not limited to the following description, and it will be easily understood by those skilled in the art that the modes and details of the present invention can be modified in various ways without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated or omitted for clarifying the invention in some cases. Therefore, embodiments of the present invention are not limited to such a scale.

The position, the size, the range, and the like of each component illustrated in the drawings and the like are not accurately represented in some cases for easy understanding of the invention. Therefore, the disclosed invention is not necessarily limited to the position, the size, the range, and the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding.

Ordinal numbers such as "first" and "second" in this specification and the like are used in order to avoid confusion among components and do not denote the priority or the order such as the order of steps or the stacking order.

Functions of the source and the drain might be switched depending on operation conditions, e.g., when a transistor having a different polarity is employed or a direction of current flow is changed in circuit operation. Therefore, it is difficult to define which is the source (or the drain). Thus, the terms "source" and "drain" can be switched in this specification.

In this specification and the like, the term "electrically connected" includes the case where components are connected to each other through an object having any electric action. There is no particular limitation on an "object having any electric function" as long as electric signals can be transmitted and received between components that are connected through the object. Accordingly, even when the expression "to be electrically connected" is used in this specification, there is a case in which no physical connection is made and a wiring is just extended in an actual circuit.

In this specification and the like, the terms "electrode" and "wiring" do not have functional limitations. For example, an "electrode" is used as part of a "wiring" in some cases, and vice versa. Moreover, the term "electrode" or "wiring" can also mean a combination of a plurality of "electrodes" and "wirings" formed in an integrated manner.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" or "vertical" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

Embodiment 1

In this embodiment, a transistor 100 is described as an example of one embodiment of a semiconductor device. Moreover, a capacitor 120 which can be manufactured at the same time as the transistor 100 is also described.

<1-1. Structural Example of Semiconductor Device>

In the transistor 100 in FIGS. 1A to 1D, a gate electrode is formed over a semiconductor layer and another gate electrode is formed under the semiconductor layer. A transistor having such a structure is called a dual-gate transistor in some cases.

FIG. 1A is a top view of the transistor 100. FIG. 1B is a cross-sectional view of a portion denoted by a dashed-dotted line A1-A2 in FIG. 1A, and FIG. 1C is a cross-sectional view of a portion denoted by a dashed-dotted line B1-B2 in FIG. 1A. FIG. 1D is an enlarged view of a portion 115 in FIG. 1B.

The transistor 100 in FIGS. 1A to 1D is formed over a substrate 101 with an insulating layer 102 provided therebetween. The transistor 100 includes a gate electrode 103, an insulating layer 104, an insulating layer 105, an oxide semiconductor layer 106a, an oxide semiconductor layer 106b, an oxide semiconductor layer 106c, a source electrode 107a, a drain electrode 107b, a gate insulating layer 108, a gate electrode 109, and an insulating layer 110. An insulating layer 111 is formed over the transistor 100 in FIGS. 1A to 1D.

Specifically, the gate electrode 103 is formed over the insulating layer 102, and a trench 112 is formed in the insulating layer 104 at a position overlapping the gate electrode 103. The insulating layer 105 is formed over the insulating layer 104. The insulating layer 105 is formed to be adjacent to side surfaces and a bottom surface of the trench 112.

In addition, the oxide semiconductor layer 106a is also formed to be adjacent to the side surfaces and the bottom surface of the trench 112. The oxide semiconductor layer 106b is formed to be in contact with the oxide semiconductor layer 106a and to be adjacent to the side surfaces and the bottom surface of the trench 112 with the oxide semiconductor layer 106a provided therebetween. The oxide semiconductor layers 106a and 106b are formed in the trench 112.

The source electrode 107a and the drain electrode 107b are formed over the insulating layer 105. Part of the source electrode 107a and part of the drain electrode 107b are in contact with part of the oxide semiconductor layer 106a and part of the oxide semiconductor layer 106b.

In addition, the oxide semiconductor layer 106c is formed to be in contact with part of the oxide semiconductor layer 106b and to overlap part of the source electrode 107a and part of the drain electrode 107b.

The gate electrode 109 is formed to overlap the oxide semiconductor layer 106c with the gate insulating layer 108 provided therebetween. Side surfaces of the gate electrode 109, the gate insulating layer 108, and the oxide semiconductor layer 106c are substantially aligned with each other.

The insulating layer 110 is formed over the gate electrode 109, the source electrode 107a, and the drain electrode 107b, and the insulating layer 111 is formed over the insulating layer 110.

Note that in this specification and the like, the "oxide semiconductor layer 106" includes the oxide semiconductor layers 106a, 106b, and 106c.

One of the gate electrode 103 and the gate electrode 109 is referred to as a "first gate electrode", and the other is referred to as a "second gate electrode" in some cases. In the case where one of the gate electrode 103 and the gate electrode 109 is referred to as a "gate electrode", the other is referred to as a "back gate electrode" in some cases.

In general, the back gate electrode is formed using a conductive layer and positioned so that the channel formation region of the semiconductor layer is interposed between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode, the threshold voltage of the transistor can be changed.

Furthermore, the gate electrode and the back gate electrode are formed using conductive layers and thus each have a function of preventing an electric field generated in the outside of the transistor from influencing the semiconductor layer in which the channel is formed (in particular, a function of preventing static electricity). That is, the variation in the electrical characteristics of the transistor due to the influence of external electric field such as static electricity can be prevented. By providing the back gate electrode, the amount of change in threshold voltage of the transistor in a reliability test (e.g., a bias-temperature (BT) stress test) can be reduced.

When the back gate electrode is formed using a light-blocking conductive layer, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

Here, the "threshold voltage" is described. When a voltage is applied to the gate electrode 109, an electric field with an intensity corresponding to the voltage is applied to the oxide semiconductor layer 106b through the gate insulating layer 108 and the oxide semiconductor layer 106c, so that carriers are generated and a channel is formed in the oxide semiconductor layer 106b. When the channel is formed, the source electrode 107a is electrically connected to the drain electrode 107b and the transistor is turned on (in an on state). The voltage of the gate electrode 109 at which the channel is formed in the oxide semiconductor layer 106b is referred to as a "threshold voltage".

In the case where the transistor 100 is an n-channel transistor, when the potential of the source electrode 107a is set to 0 V and a voltage higher than or equal to the threshold voltage is applied to the gate electrode 109, carriers are supplied from the source electrode 107a to the oxide semiconductor layer 106b and thus the channel is formed. In general, a region of the semiconductor layer where the channel is formed is referred to as a "channel formation region". At this time, when a positive voltage is applied to the drain electrode 107b, carriers flow from the source electrode 107a to the drain electrode 107b. In other words, a current flows from the drain electrode 107b to the source electrode 107a. A current flowing between the source electrode 107a and the drain electrode 107b when the transistor is in an on state is referred to as an "on-state current".

Note that the distance between the end portion of the source electrode 107a and the end portion of the drain electrode 107b which are in contact with the oxide semiconductor layer 106b and with which the gate electrode 103 and/or the gate electrode 109 overlap is referred to as a "channel length L" (see FIG. 1D). A direction parallel with a carrier flow direction is referred to as a "channel length direction". A direction perpendicular to the channel length direction and parallel with a surface of the substrate 101 is referred to as a "channel width direction".

When a voltage is applied to the gate electrode 103, an electric field with an intensity corresponding to the voltage is applied to the oxide semiconductor layer 106b through the insulating layer 105 and the oxide semiconductor layer 106a, so that carriers are induced in the oxide semiconductor layer 106b and a channel is formed. That is, the insulating layer 105 serves as a gate insulating layer. By adjusting the potentials of the gate electrode 103 and the gate electrode 109, the threshold voltage of the transistor 100 can be changed.

In the transistor 100 described in this embodiment as an example, a channel is formed in the oxide semiconductor layer 106b. Thus, in the transistor 100 described in this embodiment, the channel formation region is formed in the trench 112.

In the case of forming a channel in the oxide semiconductor layer 106b using both the gate electrodes 109 and 103, more carriers can be induced in the oxide semiconductor layer 106b compared to the case of forming the channel using only one of the gate electrodes 109 and 103. As a result, a larger amount of current can flow between the source electrode 107a and the drain electrode 107b.

Moreover, as a cross-sectional area of the oxide semiconductor layer 106b in a direction perpendicular to the surface of the substrate 101 and the channel length direction are large, a larger amount of current can flow between the source electrode 107a and the drain electrode 107b.

To increase the above cross-sectional area, one of or both the width and the thickness of the oxide semiconductor layer 106b is/are necessarily increased. However, when the width of the oxide semiconductor layer 106b is increased, an occupation area of the transistor 100 in a plan view is increased, so that a miniaturized and high-definition semiconductor device is not easily obtained.

Thus, in the transistor 100 described in this embodiment, the oxide semiconductor layer 106b is formed in the trench 112 and the thickness of the oxide semiconductor layer 106b is increased. That is, by forming the oxide semiconductor layer 106b in the trench 112, the above cross-sectional area of the oxide semiconductor layer 106b can be increased without increasing the occupation area of the transistor 100 in a plan view.

In the transistor 100 described in this embodiment, the gate electrode 109 is formed over the trench 112, the gate electrode 103 is formed under the trench 112, and a channel is formed in the oxide semiconductor layer 106b using the gate electrode 109 and the gate electrode 103. By forming a channel in the oxide semiconductor layer 106b using the gate electrode 109 and the gate electrode 103, even when the thickness of the oxide semiconductor layer 106b is increased, many carriers can be induced in the whole oxide semiconductor layer 106b.

According to one embodiment of the present invention, a transistor with favorable electrical characteristics can be obtained without increasing the occupation area in the plan view. Moreover, a transistor with favorable electrical characteristics can be obtained with a small occupation area. According to one embodiment of the present invention, a semiconductor device which can be miniaturized or highly integrated can be obtained.

[1-1-1. Substrate 101]

Although there is no particular limitation on a material which can be used as the substrate 101, it is necessary that the substrate have at least heat resistance high enough to withstand heat treatment to be performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate made of silicon, silicon carbide, or the like or a compound semiconductor substrate made of silicon germanium or the like may be used as the substrate 101. Alternatively, an SOI substrate, a substrate over which a semiconductor element is provided, or the like can also be used.

Note that a flexible substrate may also be used as the substrate 101. In the case where a flexible substrate is used, the transistor, the capacitor, or the like may be directly formed over the flexible substrate, or the transistor, the capacitor, or the like may be formed over a manufacturing substrate, and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

The substrate 101 is not limited to a simple supporting substrate, and may be a substrate where a device such as a transistor is formed. In this case, at least one of the gate electrode, the source electrode, and the drain electrode which are included in the transistor 100 may be electrically connected to the above device.

[1-1-2. Base Layer (Insulating Layer 102)]

The insulating layer 102 serves as a base layer, and can prevent or reduce diffusion of an impurity element from the substrate 101 side to the transistor 100. In particular, diffusion of an impurity element to the oxide semiconductor layer included in the transistor 100 can be prevented or reduced. The insulating layer 102 can be formed with a single layer or a stack of layers using one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, and tantalum oxide. Alternatively, a material in which two or more materials selected from an oxide material, a nitride material, an oxynitride material, and a nitride oxide material are mixed may be used.

In this specification, a nitride oxide material refers to a material containing a larger amount of nitrogen than oxygen, and an oxynitride material refers to a material containing a larger amount of oxygen than nitrogen. The content of each element can be measured by Rutherford backscattering spectrometry (RBS), for example.

The insulating layer 102 can be formed by a sputtering method, a molecular beam epitaxy (MBE) method, a chemical vapor deposition (CVD) method, a pulsed laser deposition (PLD) method, an atomic layer deposition (ALD) method, a thermal oxidation method, or the like, as appropriate. The hydrogen content of the insulating layer 102 is preferably less than $5 \times 10^{19}$ cm$^{-3}$, further preferably less than $5 \times 10^{18}$ cm$^{-3}$.

In the case where the insulating layer 102 is a stacked layer including a plurality of layers, the stacked layer may include a silicon nitride layer as a first layer and a silicon oxide layer as a second layer. In that case, the silicon oxide layer may be replaced with a silicon oxynitride layer. In addition, the silicon nitride layer may be replaced with a silicon nitride oxide layer.

The thickness of the insulating layer 102 may be greater than or equal to 10 nm and less than or equal to 500 nm, preferably greater than or equal to 50 nm and less than or equal to 300 nm.

Note that the insulating layer 102 is not necessarily provided between the substrate 101 and the transistor 100.

[1-1-3. Gate Electrode 103]

For a conductive material for forming the gate electrode 103, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor having a high electric conductivity typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The gate electrode 103 can also be formed using a conductive material containing oxygen, such as indium tin oxide (hereinafter, also referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen, such as titanium nitride or tantalum nitride. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

The gate electrode 103 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer which contains aluminum and one or more elements selected from titanium, tantalum, tungsten, molybdenum, chromium, neodymium, and scandium may be used.

Furthermore, an In—Ga—Zn-based oxynitride semiconductor layer, an In—Sn-based oxynitride semiconductor layer, an In—Ga-based oxynitride semiconductor layer, an In—Zn-based oxynitride semiconductor layer, a Sn-based oxynitride semiconductor layer, an In-based oxynitride semiconductor layer, a layer of metal nitride (such as InN or ZnN), or the like may be provided between the gate electrode 103 and the insulating layer 105. These layers each have a work function of 5 eV or higher and the electron affinity of each of these layers is larger than that of an oxide semiconductor; thus, the threshold voltage of the transistor including an oxide semiconductor in a semiconductor layer in which a channel is formed can be shifted in a positive direction. Accordingly, what is called a normally-off switching element can be obtained. For example, in the case where an In—Ga—Zn-based oxynitride semiconductor layer is provided between the gate electrode 103 and the insulating layer 105, an In—Ga—Zn-based oxynitride semiconductor layer having a higher nitrogen concentration than at least the oxide semiconductor layer 106b, specifically, an In—Ga—Zn-based oxynitride semiconductor film having a nitrogen concentration of 7 at. % or higher is used.

The thickness of the gate electrode 103 may be greater than or equal to 10 nm and less than or equal to 500 nm, preferably greater than or equal to 50 nm and less than or equal to 300 nm.

[1-1-4. Insulating Layer 104]

The insulating layer 104 can be formed using a material and a method similar to those of the insulating layer 102. Alternatively, an insulator such as borophosphosilicate glass (BPSG), phosphosilicate glass (PSG), silicon oxide to which carbon is added (SiOC), silicon oxide to which fluorine is added (SiOF), tetraethylorthosilicate (MOS) which is silicon oxide made from $Si(OC_2H_5)_4$, hydrogen silsesquioxane (HSQ), methyl silsesquioxane (MSQ), organosilicate glass (OSG), or an organic-polymer-based material may be used.

The thickness of the insulating layer 104 may be greater than or equal to 10 nm and less than or equal to 500 nm, preferably greater than or equal to 50 nm and less than or equal to 300 nm.

[1-1-5. Insulating Layer 105]

The insulating layer 105 can be formed using a material and a method similar to those of the insulating layer 102. The thickness of the insulating layer 105 may be greater than or equal to 10 nm and less than or equal to 500 nm, preferably greater than or equal to 50 nm and less than or equal to 300 nm.

[1-1-6. Oxide Semiconductor Layer]

In the transistor 100, part of the oxide semiconductor layer 106a is in contact with part of the oxide semiconductor layer 106b, and part of the oxide semiconductor layer 106c is in contact with part of the oxide semiconductor layer 106b (see FIG. 1B). Furthermore, part of the oxide semiconductor layer 106a is in contact with part of the oxide semiconductor layer 106c (see FIG. 1C). Each of the oxide semiconductor layers 106a and 106c may be a layer that exhibits an insulating property or semiconductor characteristics.

Depending on materials used for the oxide semiconductor layer 106a, the oxide semiconductor layer 106b, and the oxide semiconductor layer 106c, boundaries (interfaces) between the oxide semiconductor layer 106a, the oxide semiconductor layer 106b, and the oxide semiconductor layer 106c cannot be clearly recognized in some cases. Then, in the drawings illustrating one embodiment of the present invention, the boundaries where these oxide semiconductor layers are in contact with each other are denoted by dashed lines.

The oxide semiconductor layer 106a, the oxide semiconductor layer 106b, and the oxide semiconductor layer 106c are each formed using a material containing one or both of In and Ga. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of elements selected from Al, Ti, Ga, Y, Zr, La, Ce, Nd, and Hf).

The oxide semiconductor layers 106a and 106c are each preferably formed using a material containing one or more kinds of metal elements included in the oxide semiconductor layer 106b. With the use of such a material, interface states at interfaces between the oxide semiconductor layer 106b and each of the oxide semiconductor layers 106a and 106c are less likely to be generated. Accordingly, carriers are not likely to be scattered or captured at the interfaces, which results in an improvement in field-effect mobility of the transistor. Furthermore, variation in the threshold voltage of the transistor can be reduced. Thus, a semiconductor device having favorable electrical characteristics can be obtained.

For example, in the case where an In—Ga—Zn oxide is used for the oxide semiconductor layer 106b, a Ga oxide may be used for at least one of the oxide semiconductor layers 106a and 106c.

The oxide semiconductor layer 106a and the oxide semiconductor layer 106b are formed successively without exposure to the air so as to be kept in an inert gas atmosphere, an oxidation gas atmosphere, or a reduced pressure, whereby an interface state between the oxide semiconductor layer 106a and the oxide semiconductor layer 106b can be less likely to be generated.

The thickness of the oxide semiconductor layer 106a is greater than or equal to 3 nm and less than or equal to 100 nm, preferably greater than or equal to 3 nm and less than or equal to 50 nm. The thickness of the oxide semiconductor layer 106b is greater than or equal to 3 nm and less than or equal to 200 nm, preferably greater than or equal to 3 nm and less than or equal to 100 nm, further preferably greater than or equal to 3 nm and less than or equal to 50 nm. The thickness of the oxide semiconductor layer 106c is greater than or equal to 1 nm and less than or equal to 100 nm, preferably greater than or equal to 1 nm and less than or equal to 50 nm, further preferably greater than or equal to 1 nm and less than or equal to 10 nm.

When each of the oxide semiconductor layers 106a, 106b, and 106c is an In-M-Zn oxide and the oxide semiconductor layers 106a and 106c contain In, M, and Zn at an atomic ratio of $x_1:y_1:z_1$ and the oxide semiconductor layer 106b contains In, M, and Zn at an atomic ratio of $x_2:y_2:z_2$, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor layers 106a, 106b, and 106c in which $y_1/x_1$ is 1.5 times or more as large as $y_2/x_2$ are selected. Still further preferably, the oxide semiconductor layers 106a, 106b, and 106c in which $y_1/x_1$ is twice or more as large as $y_2/x_2$ are selected. Still further preferably, the oxide semiconductor layers 106a, 106b, and 106c in which $y_1/x_1$ is three times or more as large as $y_2/x_2$ are selected. At this time, $y_2$ is preferably greater than or equal to $x_2$ in the oxide semiconductor layer 106b, in which case stable electrical characteristics of a transistor can be achieved. However, when $y_2$ is three times or more as large as $x_2$, the field-effect mobility of the transistor is reduced; accordingly, $y_2$ is preferably smaller than three times $x_2$. When the oxide semiconductor layers 106a and 106c each have the above structure, each of the oxide semiconductor layers 106a and 106c can be a layer in which oxygen vacancy is less likely to occur than in the oxide semiconductor layer 106b.

In the case of using an In-M-Zn oxide for the oxide semiconductor layers 106a and 106c, when Zn and O are eliminated from consideration, the atomic ratio between In and M is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %. In the case of using an In-M-Zn oxide for the oxide semiconductor layer 106b, when Zn and O are eliminated from consideration, the atomic ratio between In and M is preferably as follows: the atomic percentage of In is greater than or equal to 25 atomic % and the atomic percentage of M is less than 75 atomic %; further preferably, the atomic percentage of In is greater than or equal to 34 atomic % and the atomic percentage of M is less than 66 atomic %.

For example, an In—Ga—Zn oxide which is formed using a target having an atomic ratio of In:Ga:Zn=1:3:2, 1:3:4, 1:3:6, 1:6:4, 1:9:6, or 1:9:0 can be used for each of the oxide semiconductor layers 106a and 106c containing In or Ga, and an In—Ga—Zn oxide which is formed using a target having an atomic ratio of In:Ga:Zn=1:1:1 or 3:1:2 can be used for the oxide semiconductor layer 106b. In each of the oxide semiconductor layers 106a, 106b, and 106c, the proportions of the atoms in the atomic ratio vary within a range of ±20% as an error.

In order to give stable electrical characteristics to the transistor including the oxide semiconductor layer 106b, it is preferable that impurities and oxygen vacancies in the oxide semiconductor layer 106b be reduced to be highly purified so that the oxide semiconductor layer 106b can be regarded as an intrinsic or substantially intrinsic semiconductor layer. Furthermore, it is preferable that at least the channel formation region of the oxide semiconductor layer 106b be regarded as an intrinsic or substantially intrinsic semiconductor layer.

Note that the substantially intrinsic semiconductor layer refers to an oxide semiconductor layer in which the carrier density is lower than $1 \times 10^{17}/cm^3$, lower than $1 \times 10^{15}/cm^3$, or lower than $1 \times 10^{13}/cm^3$.

In the oxide semiconductor layer 106b, hydrogen, nitrogen, carbon, silicon, and a metal element other than main components are impurities. In order to reduce impurities in the oxide semiconductor layer 106b, it is preferable to also reduce impurities in the oxide semiconductor layers 106a and 106c which are close to the oxide semiconductor layer 106b to a value almost equal to that in the oxide semiconductor layer 106b.

Particularly when silicon is contained in the oxide semiconductor layer 106b at a high concentration, an impurity state due to silicon is formed in the oxide semiconductor layer 106b. In some cases, the impurity state becomes a trap, which degrades electrical characteristics of the transistor. In order to make the deterioration of the electrical characteristics of the transistor small, the concentration of silicon in the oxide semiconductor layer 106b is set to be lower than $1 \times 10^{19}$ atoms/$cm^3$, preferably lower than $5 \times 10^{18}$ atoms/$cm^3$, further preferably lower than $1 \times 10^{18}$ atoms/$cm^3$. Moreover, the concentrations of silicon at the interface between the oxide semiconductor layer 106a and the oxide semiconductor layer 106b and the interface between the oxide semiconductor layer 106b and the oxide semiconductor layer 106c are each set to be lower than $1 \times 10^{19}$ atoms/$cm^3$, preferably lower than $5 \times 10^{18}$ atoms/$cm^3$, more preferably lower than $1 \times 10^{18}$ atoms/$cm^3$.

Furthermore, hydrogen and nitrogen in the oxide semiconductor layer 106b form donor levels, which increase carrier density. In order to make the oxide semiconductor layer 106b intrinsic or substantially intrinsic, the concentration of hydrogen in the oxide semiconductor layer 106b, which is measured by SIMS, is set to be lower than or equal to $2 \times 10^{20}$ atoms/$cm^3$, preferably lower than or equal to $5 \times 10^{19}$ atoms/$cm^3$, more preferably lower than or equal to $1 \times 10^{19}$ atoms/$cm^3$, still more preferably lower than or equal to $5 \times 10^{18}$ atoms/$cm^3$. The concentration of nitrogen in the oxide semiconductor layer 106b, which is measured by SIMS, is set to be lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

Note that when silicon and carbon are contained in the oxide semiconductor layer 106b at a high concentration, the crystallinity of the oxide semiconductor layer 106b is lowered in some cases. In order not to lower the crystallinity of the oxide semiconductor layer 106b, the concentration of silicon in the oxide semiconductor layer 106b is set to be lower than $1\times10^{19}$ atoms/cm$^3$, preferably lower than $5\times10^{18}$ atoms/cm$^3$, further preferably lower than $1\times10^{18}$ atoms/cm$^3$. Moreover, in order not to lower the crystallinity of the oxide semiconductor layer 106b, the concentration of carbon in the oxide semiconductor layer 106b is set to be lower than $1\times10^{19}$ atoms/cm$^3$, preferably lower than $5\times10^{18}$ atoms/cm$^3$, further preferably lower than $1\times10^{18}$ atoms/cm$^3$.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm Note that when a plurality of crystal parts included in the CAAC-OS film are connected to each other, one large crystal region is formed in some cases. For example, a crystal region with an area of 2500 nm$^2$ or more, 5 µm$^2$ or more, or 1000 µm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Furthermore, there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction image (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in an electron diffraction (also referred to as a nanobeam electron diffraction) pattern of the nc-OS film obtained by using an electron beam having a probe diameter (e.g., larger than or equal to 1 nm and smaller than or equal to 30 nm) close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

The oxide semiconductor has a band gap of 2 eV or more; therefore, a transistor including an oxide semiconductor in a semiconductor layer in which a channel is formed has extremely small leakage current (also referred to as an extremely small off-state current) when the transistor is off. Specifically, in a transistor whose channel length is 3 µm and channel width is 10 µm, the off-state current can be lower than $1\times10^{-20}$ A, preferably lower than $1\times10^{-22}$ A, further preferably lower than $1\times10^{-24}$ A. That is, the on/off ratio can be greater than or equal to 20 digits and less than or equal to 150 digits.

[1-1-7. Source Electrode 107a and Drain Electrode 107b]

The source electrode 107a and the drain electrode 107b can be formed using a material and a method similar to those of the gate electrode 103.

The source electrode 107a and the drain electrode 107b may have a single-layer structure or a stacked-layer structure of two or more layers. For example, a single-layer structure of an aluminum layer containing silicon, a two-layer structure in which an aluminum layer and a titanium layer are stacked, a two-layer structure in which a titanium nitride layer and a titanium layer are stacked, a two-layer structure in which a titanium nitride layer and a tungsten layer are stacked, a two-layer structure in which a tantalum nitride layer and a tungsten layer are stacked, a two-layer structure in which a tungsten layer and a copper layer are stacked, a three-layer structure in which a titanium layer, an aluminum layer, and a titanium layer are stacked in this order, and the like can be given. Alternatively, an alloy which contains aluminum and one or more elements selected from titanium, tantalum, tungsten, molybdenum, chromium, neodymium, and scandium may be used.

A material which is capable of removing oxygen from part of the oxide semiconductor layer 106b to generate oxygen vacancies is preferably used for regions of the source and drain electrodes 107a and 107b which are in contact with at least the oxide semiconductor layer 106b. The carrier concentration of the regions of the oxide semiconductor layer 106b in which oxygen vacancies are generated is increased, so that the regions become n-type regions ($n^+$ layers). Accordingly, the regions can function as a source region and a drain region. Examples of the material which is capable of removing oxygen from the oxide semiconductor layer 106b to generate oxygen vacancies include tungsten and titanium.

Formation of the source region and the drain region in the oxide semiconductor layer 106b makes it possible to reduce contact resistance between the oxide semiconductor layer 106b and each of the source and drain electrodes 107a and 107b. Accordingly, the electrical characteristics of the transistor, such as the field-effect mobility and the threshold voltage, can be favorable.

Note that the source electrode 107a and the drain electrode 107b preferably each have a thickness greater than or equal to 10 nm and less than or equal to 500 nm, further preferably greater than or equal to 50 nm and less than or equal to 300 nm.

[1-1-8. Gate Insulating Layer 108]

The gate insulating layer 108 can be formed using a material and a method similar to those of the insulating layer 102. The thickness of the gate insulating layer 108 may be greater than or equal to 1 nm and less than or equal to 100 nm, preferably greater than or equal to 10 nm and less than or equal to 50 nm.

The gate insulating layer 108 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is less than or equal to $3\times10^{17}$ spins/cm$^3$, preferably less than or equal to $5\times10^{16}$ spins/cm$^3$ is used. As the silicon oxide layer, a silicon oxide layer containing excess oxygen is preferably used. As the silicon nitride layer, a silicon nitride layer from which hydrogen and ammonia are less likely to be released is used. The amount of released hydrogen or ammonia may be measured by TDS.

Generally, a capacitor has such a structure that a dielectric is interposed between two electrodes that face to each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, because of a tunnel effect or the like, leakage current flowing between the two electrodes tends to increase and the withstand voltage of the capacitor tends to lower.

A portion where a gate electrode, a gate insulating layer, and a semiconductor layer of a transistor overlap with each other serves as the above-described capacitor (hereinafter also referred to as "gate capacitor"). A channel is formed in a region in the semiconductor layer, which overlaps with the gate electrode with the gate insulating layer provided therebetween. In other words, the gate electrode and the channel formation region function as two electrodes of the capacitor, and the gate insulating layer serves as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as a hafnium silicate (HfSi$_x$O$_y$, (x>0, y>0)), a hafnium silicate to which nitrogen is added (HfSi$_x$O$_y$N$_z$ (x>0, y>0, z>0)), a hafnium aluminate to which nitrogen is added (HfAlO$_x$N$_y$ (x>0, y>0, z>0)), hafnium oxide, or yttrium oxide is used for the gate insulating layer 108, even if the thickness of the gate insulating layer 108 is made thick, sufficient capacitance between the gate insulating layer 108 and the oxide semiconductor layer 106b can be ensured.

For example, in the case where a high-k material with a high dielectric constant is used for the gate insulating layer 108, even if the gate insulating layer 108 is made thick, a capacitance equivalent to that in the case of using silicon oxide for the gate insulating layer 108 can be obtained, thereby reducing the leakage current between the gate electrode 109 and the oxide semiconductor layer 106b. Furthermore, leakage current between the wiring formed of the same layer as the gate electrode 109 and another wiring that overlaps with the wiring can also be reduced. The gate insulating layer 108 may have a stacked-layer structure of the high-k material and the above-described material.

Note that the oxide semiconductor layer 106c can be regarded as part of the gate insulating layer. The oxide semiconductor layer 106c and the gate insulating layer 108 are stacked, whereby withstand voltage between the gate electrode 109 and each of the source electrode 107a and the drain electrode 107b can be improved. Accordingly, a highly reliable semiconductor device can be obtained.

[1-1-9. Gate Electrode 109]

The gate electrode 109 can be formed using a material and a method similar to those of the gate electrode 103. The thickness of the gate electrode 109 may be greater than or equal to 10 nm and less than or equal to 500 nm, preferably greater than or equal to 50 nm and less than or equal to 300 nm.

[1-1-10. Insulating Layer 110]

The insulating layer 110 can be formed using a material and a method similar to those of the insulating layer 102. The thickness of the insulating layer 110 may be greater than or equal to 10 nm and less than or equal to 500 nm, preferably greater than or equal to 50 nm and less than or equal to 300 nm.

[1-1-11. Insulating Layer 111]

The insulating layer 111 can be formed using a material and a method similar to those of the insulating layer 104. The thickness of the insulating layer 111 may be greater than or equal to 10 nm and less than or equal to 500 nm, preferably greater than or equal to 50 nm and less than or equal to 300 nm.

<1-2. Structural Example of Capacitor>

Next, the structure of the capacitor 120 which can be manufactured at the same time as the transistor 100 is described.

Figure 2B:
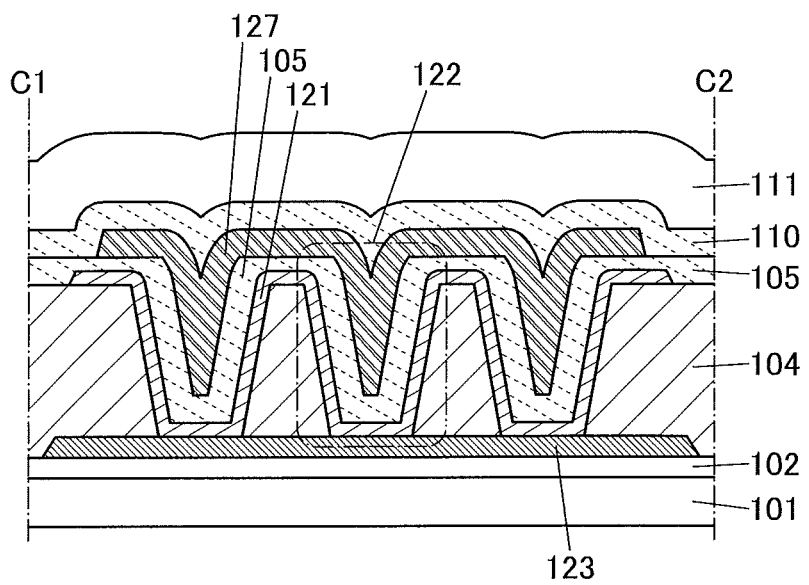

FIG. 2A is a top view of the capacitor 120. FIG. 2B is a cross-sectional view of a portion denoted by a dashed-dotted line C1-C2 in FIG. 2A. The insulating layer 102 is formed over the substrate 101, an electrode 123 is formed over the insulating layer 102, and the insulating layer 104 is formed over the electrode 123. A trench 122 is formed in the insulating layer 104 in a region overlapping the electrode 123.

The capacitor 120 includes the insulating layer 105 between an electrode 121 and an electrode 127. The insulating layer 105 serves as a dielectric layer included in the capacitor 120. Furthermore, the capacitor 120 is formed along a plurality of trenches 122 formed in the insulating layer 104. The electrode 121 is in contact with the electrode 123 at a bottom surface of the trench 122. Moreover, the insulating layers 110 and 111 are formed over the capacitor 120.

The plurality of trenches 122 is formed in the insulating layer 104 in a region overlapping the capacitor 120, whereby an area in which the electrode 121, the insulating layer 105, and the electrode 127 overlap with each other can be increased. That is, the capacitor 120 is formed along the trenches 122, whereby the capacitance of the capacitor 120 can be increased without increasing the occupation area in a plan view. The capacitor 120 with desired capacitance can be obtained with a small occupation area. According to one embodiment of the present invention, a semiconductor device which can be miniaturized or highly integrated can be obtained.

In order to adequately cover an uneven surface, the electrode 121 is formed as thin as possible. However, when the electrode 121 is formed to be thin, the electric resistance of the electrode 121 is increased and the power consumption is increased. Moreover, it takes a long time to accumulate electric charges in the capacitor 120 and release electric charges from the capacitor 120; thus, the operation speed of the semiconductor device using the capacitor is easily decreased. Then, the electrode 121 and the electrode 123 are provided to be in contact with each other, whereby the electric charge can be supplied to the capacitor 120 efficiently.

[1-2-1. Electrode 123]

The electrode 123 can be formed using part of the conductive layer for forming the gate electrode 103 in the same process as that of the gate electrode 103.

[1-2-2. Electrode 121]

The electrode 121 can be formed using a material and a method similar to those of the gate electrode 103.

[1-2-3. Electrode 127]

The electrode 127 can be formed using part of the conductive layer for forming the source electrode 107a and the drain electrode 107b in the same process as that of the source electrode 107a and the drain electrode 107b.

[1-2-4. Other Structures of Capacitor]

Figure 12A:
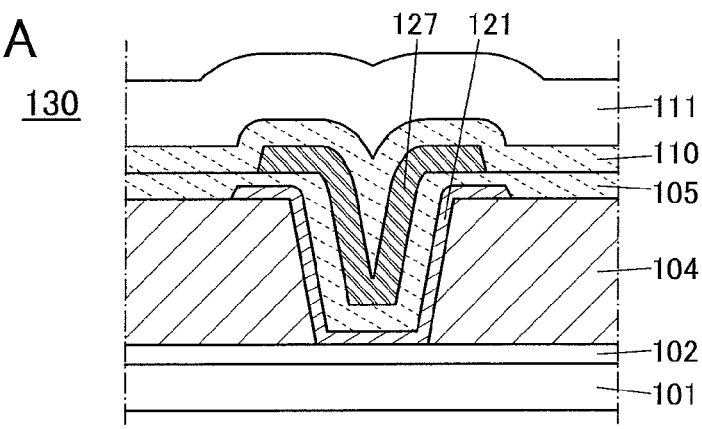
FIGS. 12A to 12C illustrate structure examples of capacitors.

FIG. 12A shows a cross-sectional structure of a capacitor 130. As the capacitor 130, the number of trench 122 overlapping the capacitor may be one depending on the size of the capacitor. The electrode 123 may be omitted as needed.

Figure 12B:
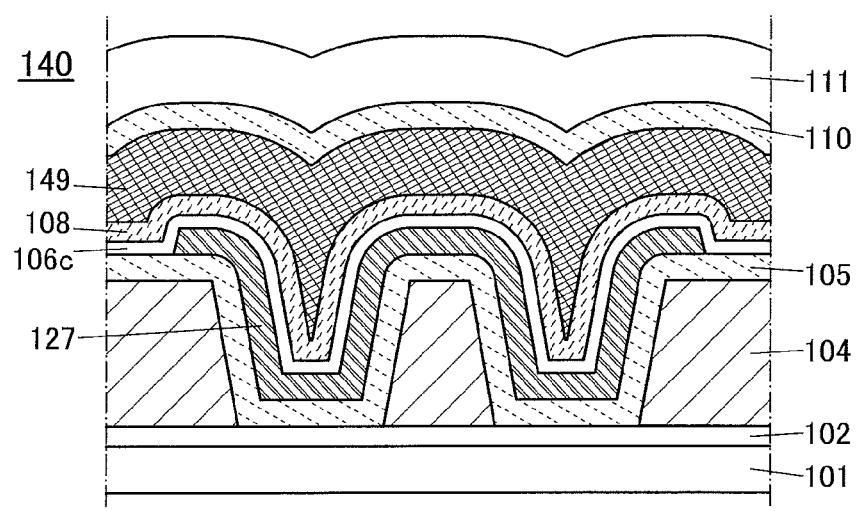

FIG. 12B shows a cross-sectional structure of a capacitor 140. In the capacitor 140, the gate insulating layer 108 and the oxide semiconductor layer 106c are interposed between the electrode 127 and an electrode 149. The electrode 149 can be formed in the same process as that of the gate electrode 109.

Figure 12C:
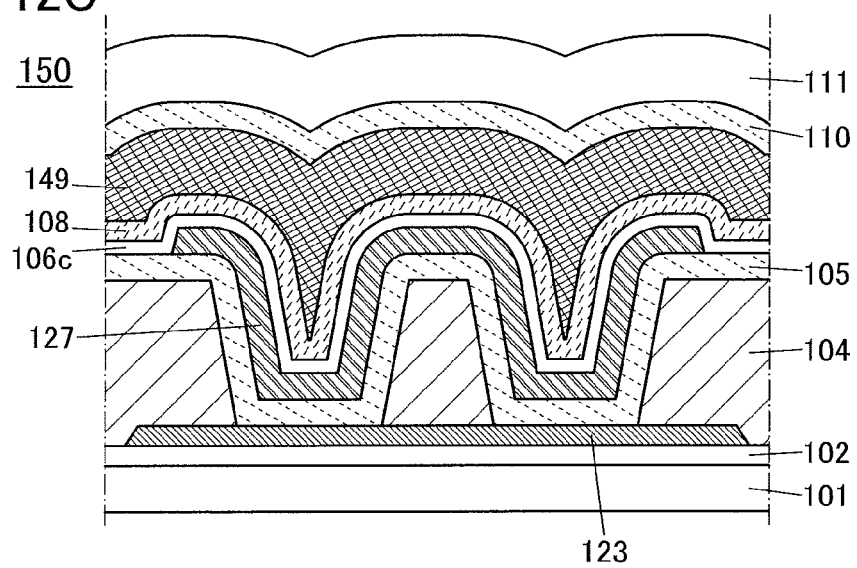

FIG. 12C shows a cross-sectional structure of a capacitor 150. The capacitor 150 has a structure in which the electrode 123 is added to the structure of the capacitor 140. A region in which the electrodes 123 and 127 overlap with each other with the insulating layer 105 provided therebetween can serve as the capacitor. When the electrodes 149 and 123 have the same potential, a capacitance higher than that of the capacitor 140 can be obtained even with the same occupation area of the capacitor 140.

<1-3. Example of Method for Manufacturing Semiconductor Device>

As an example of a method for manufacturing a semiconductor device, a method by which the transistor 100 and the capacitor 120 are formed at the same time is described with reference to cross-sectional views illustrated in FIGS. 3A to 3C, FIGS. 4A and 4B, FIGS. 5A and 5B, FIGS. 6A and 6B, and FIGS. 7A and 7B.

[1-3-1. Formation of Insulating Layer 102]

Figure 3A:
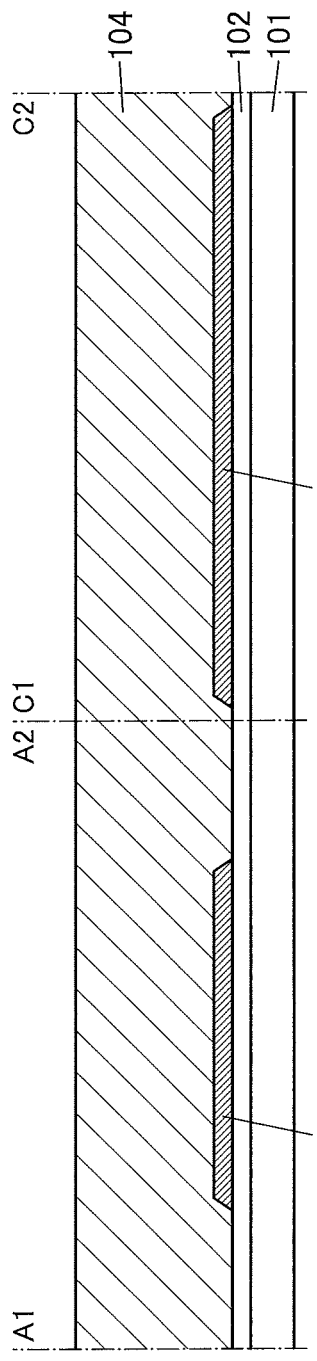
FIGS. 3A to 3C illustrate steps of manufacturing a semiconductor device.

The insulating layer 102 is formed over the substrate 101 (see FIG. 3A). For example, a glass substrate is used as the substrate 101. Next, an example in which the insulating layer 102 has a stacked-layer structure of a silicon nitride layer, a first silicon oxide layer, and a second silicon oxide layer is described.

First, a silicon nitride layer is formed over the substrate 101. The silicon nitride layer is preferably formed by a plasma CVD method, which is a kind of CVD method. Specifically, the silicon nitride layer may be formed by supplying high-frequency power under the following conditions: the substrate temperature is higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of the ammonia gas facilitates decomposition of the deposition gas containing silicon and the nitrogen gas. This is because an ammonia gas is dissociated by plasma energy and heat energy, and energy generated by the dissociation contributes to decomposition of a molecular bond of the deposition gas containing silicon and a molecular bond of the nitrogen gas.

Through the above method, the silicon nitride layer from which the hydrogen gas and the ammonia gas are less likely to be released can be formed. Furthermore, owing to the low hydrogen content, a dense silicon nitride layer through which hydrogen, water, and oxygen do not permeate or hardly permeate can be formed.

Next, a first silicon oxide layer is formed. The first silicon oxide layer is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode under the following conditions: the substrate temperature is set to be higher than or equal to 160° C. and lower than or equal to 350° C., preferably higher than or equal to 180° C. and lower than or equal to 260° C.; a deposition gas containing silicon and an oxidation gas are used; and the pressure is set to be higher than or equal to 100 Pa and lower than or equal to 250 Pa, preferably higher than or equal to 100 Pa and lower than or equal to 200 Pa.

According to the above-described method, the gas decomposition efficiency in plasma is enhanced, oxygen radicals are increased, and oxidation of the gas is promoted; as a result, the first silicon oxide layer can contain excess oxygen.

Then, a second silicon oxide layer is formed. The second silicon oxide layer is preferably formed by a plasma CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon and an oxidation gas are used; and the pressure is set to be higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidation gas include oxygen, ozone, nitrous oxide, and nitrogen dioxide.

Note that when the flow rate of the oxidation gas is 100 times as high as that of the deposition gas containing silicon, the hydrogen content and dangling bonds in the second silicon oxide layer can be reduced.

In such a manner, the second silicon oxide layer whose defect density is lower than the first silicon oxide layer is formed. In other words, the second silicon oxide layer can have a density of spins corresponding to a signal with a g factor of 2.001 in ESR less than or equal to $3 \times 10^{17}$ spins/cm$^3$, or less than or equal to $5 \times 10^{16}$ spins/cm$^3$.

[1-3-2. Formation of Gate Electrode 103 and Electrode 123]

Then, a conductive layer for forming the gate electrode 103 and the electrode 123 (including other electrodes and wirings formed using the same layer) is formed over the insulating layer 102. In this embodiment, the conductive layer is a stack including titanium nitride and tungsten. Specifically, a 10-nm-thick titanium nitride film is formed over the insulating layer 102 by a sputtering method and a 10-nm-thick tungsten film is formed over the titanium nitride layer by a sputtering method.

Then, part of the conductive layer is selectively etched using a resist mask, so that the gate electrode 103 and the electrode 123 (including other electrodes and wirings formed using the same layer) is formed. The resist mask can be formed by a photolithography method, a printing method, an inkjet method, or the like as appropriate. Formation of the resist mask by an inkjet method needs no photomask; thus, manufacturing cost can be reduced.

The etching of the conductive layer may be performed by a dry etching method, a wet etching method, or both a dry etching method and a wet etching method. After the etching of the conductive layer, the resist mask is removed (see FIG. 3A).

[1-3-3. Formation of Insulating Layer 104]

Then, the insulating layer 104 is formed over the gate electrode 103 and the electrode 123. Here, as the insulating layer 104, a silicon oxynitride layer is formed. Specifically, a 120-nm-thick silicon oxynitride layer is formed by a plasma CVD method.

In order to reduce surface roughness of the insulating layer 104, planarization treatment may be performed on the surface of the insulating layer 104. In this embodiment, the planarization treatment is performed by chemical mechanical polishing (hereinafter, referred to as CMP treatment). By the planarization treatment, the insulating layer 104 over the gate electrode 103 is formed to have a thickness of 100 nm (see FIG. 3A).

As the planarization treatment, in addition to polishing treatment such as CMP treatment, etching treatment or the like can be used. The planarization treatment in which CMP treatment and etching treatment are combined may be performed.

[1-3-4. Formation of Trench 112 and Trench 122]

Figure 3B:
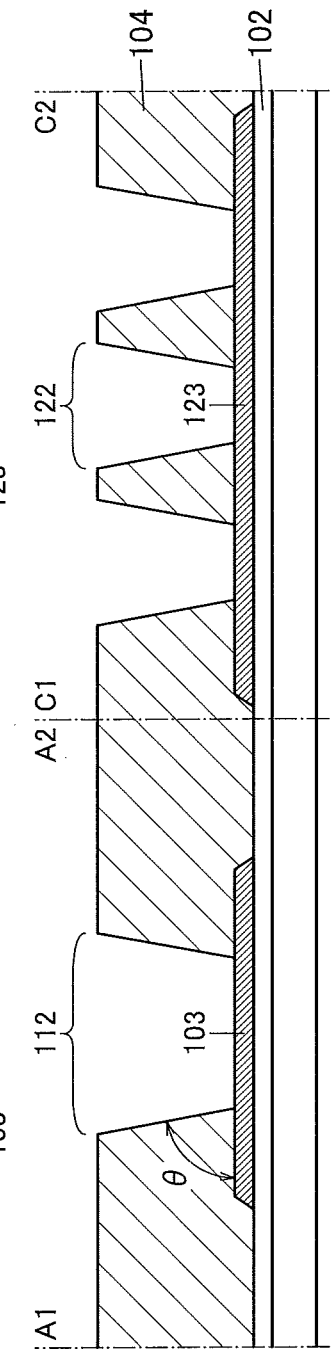
Figure 3C:
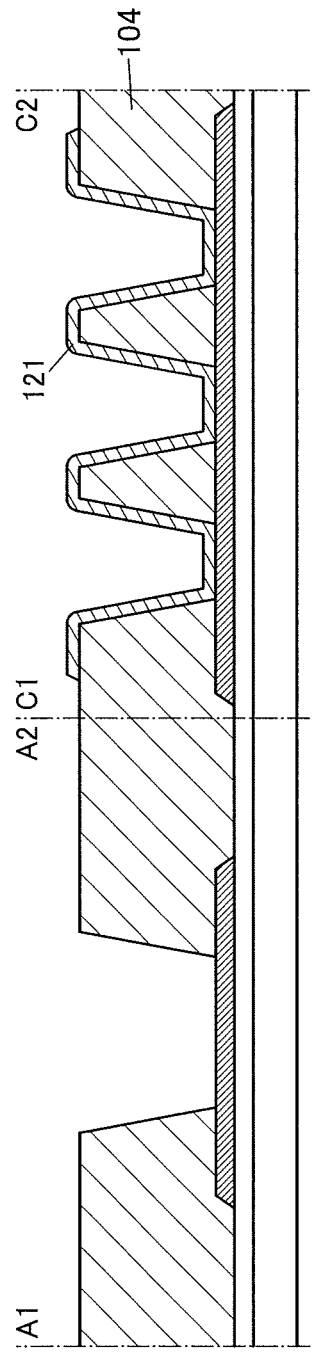
Figure 6A:
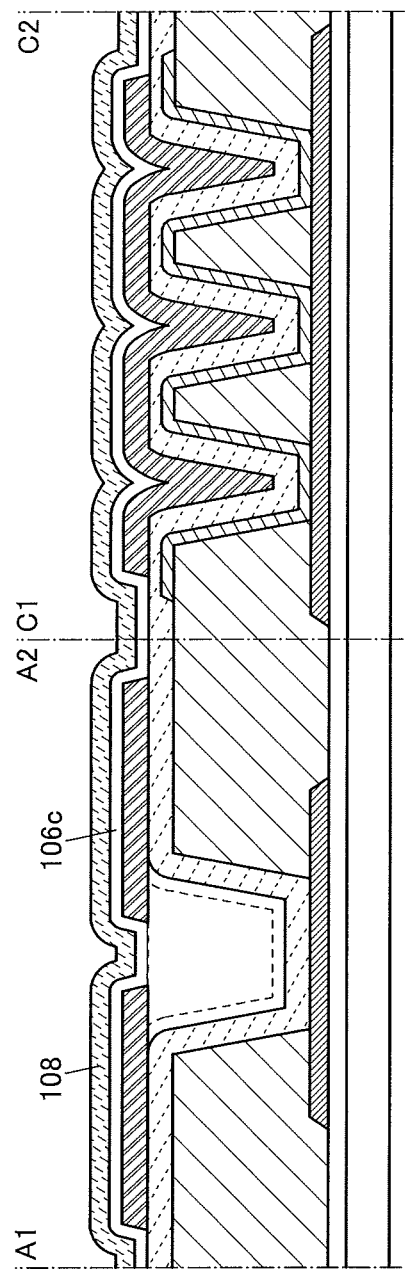
FIGS. 6A and 6B illustrate steps of manufacturing a semiconductor device.
Figure 6B:
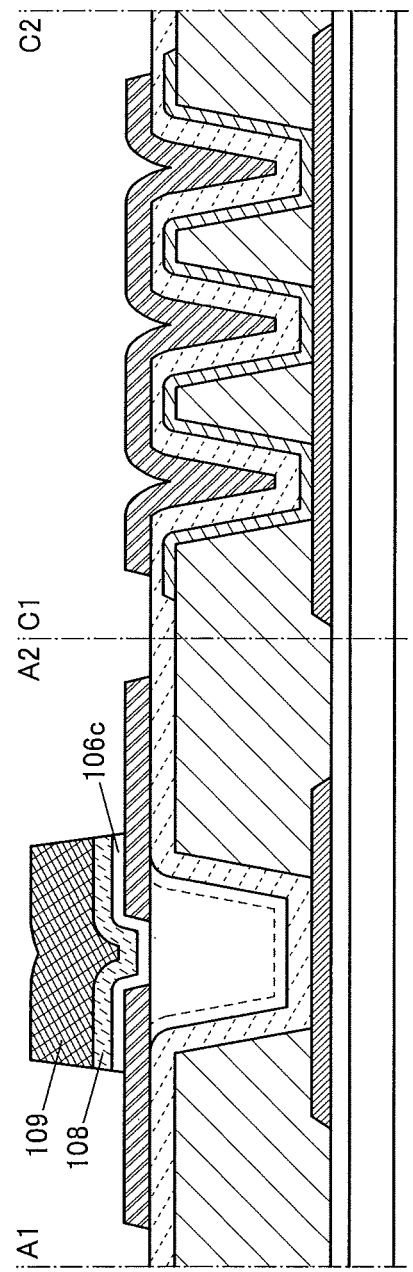

Next, with the use of a resist mask, part of the insulating layer 104 overlapping with the gate electrode 103 is selectively removed (etched) to form the trench 112 and part of the insulating layer 104 overlapping with the electrode 123 is selectively removed to form the trench 122 (see FIG. 3B).

The insulating layer 104 may be removed using either dry etching or wet etching, or using both dry etching and wet etching. The insulating layer 104 is preferably removed under a condition in which the etching rate of the insulating layer 104 is higher than those of the gate electrode 103 and the electrode 123. By performing etching under such a condition, the gate electrode 103 and the electrode 123 can serve as etching stoppers.

In the case where the gate electrode 103 and the electrode 123 are not formed, the etching rate of the insulating layer 104 is preferably higher than that of the insulating layer 102. By performing etching under such a condition, the insulating layer 102 can serve as an etching stopper.

By providing an etching stopper, the depths of the trenches 112 and 122 can be easily controlled.

When the side surfaces of the trenches 112 and 122 each have a tapered shape, the coverage with layers covering the side surfaces of the trenches 112 and 122 can be improved. Specifically, the side surfaces each have a taper angle θ of 80° or less, preferably 60° or less, further preferably 45° or less. Note that the "taper angle" refers to an inclination angle formed by a side surface and a bottom surface of a layer having a taper shape when the layer is seen from the direction perpendicular to the cross section of the layer (i.e., the plane perpendicular to the surface of the substrate). A taper angle smaller than 90° is called forward tapered angle and a taper angle larger than or equal to 90° is called inverse tapered angle (see FIG. 3B). When the cross-section of each of the side surfaces of the trenches 112 and 122 has a step-like shape including a plurality of steps, the coverage with the layers covering the trenches 112 and 122 can be improved.

[1-3-5. Formation of Electrode 121]

Then, a conductive layer for forming the electrode 121 (including other electrodes and other wirings formed using the same layer) is formed over the insulating layer 104 and along the trench 122. In this embodiment, as the conductive layer, a 20-nm-thick ITO film is formed by a sputtering method.

Then, part of the conductive layer is selectively etched using a resist mask, so that the electrode 121 (including other electrodes and other wirings formed using the same layer) is formed. The etching of the conductive layer may be performed by a dry etching method, a wet etching method, or both a dry etching method and a wet etching method. After the etching of the conductive layer, the resist mask is removed (see FIG. 3C).

[1-3-6. Formation of Insulating Layer 105]

Then, the insulating layer 105 is formed. In this embodiment, a 30-nm-thick aluminum oxide layer is formed by a sputtering method as the insulating layer 105.

As the insulating layer 105, an insulating layer containing excess oxygen is preferably used. In this specification and the like, "excess oxygen" refers to oxygen in excess of the stoichiometric composition, for example. Alternatively, excess oxygen refers to oxygen released by heating, for example. Excess oxygen can move inside a film or a layer. Excess oxygen moves between atoms in a film or a layer or excess oxygen replace oxygen that is a constituent of a film or a layer and moves like a billiard ball.

That is, an insulating layer containing excess oxygen refers to an insulating layer from which oxygen can be released by heat treatment. In addition, a silicon oxide layer containing excess oxygen refers to a silicon oxide layer from which oxygen can be released by heat treatment or the like. In addition, an aluminum oxide layer containing excess oxygen refers to an aluminum oxide layer from which oxygen can be released by heat treatment or the like.

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As the ion doping apparatus, an ion doping apparatus with a mass separation function may be used. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

In the case where the aluminum oxide film is formed by a sputtering method, a sputtering target in which silicon oxide is added to aluminum oxide may be used.

Specifically, the concentration of hydrogen in the insulating layer 105 is preferably lower than $5 \times 10^{19}$ cm$^{-3}$, further preferably lower than $5 \times 10^{18}$ cm$^{-3}$.

[1-3-7. Formation of Oxide Semiconductor Layer 106a and Oxide Semiconductor Layer 106b]

Then, the oxide semiconductor layers 106a and 106b are formed over the insulating layer 105. The oxide semiconductor layers 106a and 106b each can be formed by a sputtering method, a coating method, a pulsed laser deposition method, a laser ablation method, or the like.

In the case where the oxide semiconductor layers 106a and 106b containing In or Ga are formed by a sputtering method, an RF power supply device, an AC power supply device, a DC power supply device, or the like can be used as appropriate as a power supply device for generating plasma.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. A gas having a low impurity concentration is used as the sputtering gas. Specifically, a sputtering gas whose dew point is −40° C. or lower, preferably −60° C. or lower is preferably used.

A target is selected as appropriate in accordance with the compositions of the oxide semiconductor layers 106a and 106b which are to be formed.

Note that heating during the formation of the oxide semiconductor layers 106a and 106b may be performed at a substrate temperature higher than or equal to 100° C. and lower than or equal to 500° C., preferably higher than or equal to 170° C. and lower than or equal to 350° C.

In this embodiment, the oxide semiconductor layers 106a and 106b are formed by a sputtering method. First, a 20-nm-thick In—Ga—Zn oxide layer is formed as the oxide semiconductor layer 106a over the insulating layer 105, using a target having an atomic ratio of In:Ga:Zn=1:3:6. Then, a 60-nm-thick In—Ga—Zn oxide layer is formed as the oxide semiconductor layer 106b over the oxide semiconductor layer 106a, using a target having an atomic ratio of In:Ga:Zn=1:1:1 (see FIG. 4A).

In this embodiment, a CAAC-OS is used for the oxide semiconductor layer 106b. Four examples of a method for forming a CAAC-OS are described.

The first method is to form an oxide semiconductor at a temperature higher than or equal to 100° C. and lower than or equal to 500° C., whereby crystal parts in which the c-axes are aligned in the direction parallel to a normal vector of a surface on which the oxide semiconductor is formed or a normal vector of a surface of the oxide semiconductor are formed in the oxide semiconductor.

The second method is to form an oxide semiconductor with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor are formed in the oxide semiconductor.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

The fourth method is to form an oxide semiconductor which includes crystal parts in which the c-axes are aligned in a direction parallel to a normal vector of a surface on which the oxide semiconductor is formed or a normal vector of a surface of the oxide semiconductor, with the use of a target including a polycrystalline oxide semiconductor with high alignment.

In a transistor in which a CAAC-OS is used for a semiconductor layer including a channel, electrical characteristics variation due to irradiation with visible light or ultraviolet light is small. Thus, the transistor in which a CAAC-OS is used for the oxide semiconductor layer including the channel has high reliability.

For the deposition of the CAAC-OS, the following conditions are preferably used.

By reducing the amount of impurities entering the CAAC-OS during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of the impurities in a sputtering gas may be reduced. Specifically, a sputtering gas whose dew point is −40° C. or lower, preferably −60° C. or lower is preferably used.

By increasing the heating temperature of the surface where the CAAC-OS is formed (for example, the substrate heating temperature) during the deposition, migration of a sputtered particle is likely to occur after the sputtered particle reaches the surface where the CAAC-OS is formed. Specifically, the temperature of the surface where the CAAC-OS is formed during the deposition is higher than or equal to 100° C. and lower than or equal to 740° C., preferably higher than or equal to 150° C. and lower than or equal to 500° C.

Furthermore, it is preferable that the proportion of oxygen in the sputtering gas be increased and the power be optimized in order to reduce plasma damage at the time of deposition. The proportion of oxygen in the sputtering gas is preferably higher than or equal to 30 vol % and lower than or equal to 100 vol %.

As an example of the sputtering target, an In—Ga—Zn-based metal oxide target is described below.

The In—Ga—Zn-based metal oxide target which is polycrystalline is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 2:1:4, 4:2:3, or 3:1:2. The kinds of powder and the molar ratio for mixing powder may be determined as appropriate depending on the desired sputtering target.

An oxide semiconductor layer which is formed by a sputtering method contains hydrogen, water, a compound having a hydroxyl group, or the like in some cases. Hydrogen, water, and the like easily form a donor level and thus serve as impurities in the oxide semiconductor. Therefore, in the formation of an oxide semiconductor layer by a sputtering method, the hydrogen concentration of the oxide semiconductor layer is preferably reduced as much as possible.

When the leakage rate of the treatment chamber of the sputtering apparatus is set to lower than or equal to $1\times10^{-10}$ Pa·m$^3$/second at the formation of the oxide semiconductor layer, entry of impurities such as an alkali metal or hydride into the oxide semiconductor layer that is being formed by a sputtering method can be reduced. An inert gas such as nitrogen and argon is slightly sent to an evacuation system, whereby counter flow of a gas to be evacuated can be reduced. Furthermore, with the use of an entrapment vacuum pump (e.g., a cryopump) as an evacuation system, counter flow of impurities such as an alkali metal, a hydrogen atom, a hydrogen molecule, water, a compound having a hydroxyl group, and hydride from the evacuation system can be reduced.

When the purity of the target is set to 99.99% or higher, entry of alkali metal, hydrogen atoms, hydrogen molecules, water, a hydroxyl group, hydride, and the like into the oxide semiconductor layer can be suppressed. In addition, when the target is used, the concentration of alkali metal such as lithium, sodium, or potassium in the oxide semiconductor layer can be reduced. The silicon concentration of the target is preferably lower than or equal to $1\times10^{18}$ atoms/cm$^3$.

In order that impurities such as water and hydrogen in the oxide semiconductor layers 106a and 106b are further reduced (dehydration or dehydrogenation are performed) to highly purify the oxide semiconductor layers 106a and 106b, the oxide semiconductor layers 106a and 106b are preferably subjected to heat treatment. For example, the oxide semiconductor layers 106a and 106b are subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere containing an oxidation gas such as oxygen, ozone, or nitrogen oxide at 10 ppm or higher. The inert gas atmosphere refers to an atmosphere containing the oxidation gas at lower than 10 ppm and is filled with nitrogen or a rare gas.

The heat treatment may be performed at a temperature higher than or equal to 250° C. and lower than or equal to 650° C., preferably higher than or equal to 300° C. and lower than or equal to 500° C. The treatment time is 3 minutes to 24 hours. Heat treatment for over 24 hours is not preferable because the productivity is reduced.

There is no particular limitation on a heating apparatus used for the heat treatment, and the apparatus may be provided with a device for heating an object to be processed by heat radiation or heat conduction from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the heat treatment, impurities such as hydrogen (water, a compound having a hydroxyl group) can be released from the oxide semiconductor layers 106a and 106b. Thus, the impurities in the oxide semiconductor layers 106a and 106b can be reduced, so that the oxide semiconductor layers 106a and 106b can be highly purified. Furthermore, in particular, hydrogen serving as an unstable carrier source can be detached from the oxide semiconductor layers 106a and 106b; therefore, the negative shift of the threshold voltage of the transistor can be prevented. As a result, the reliability of the transistor can be improved.

By heat treatment performed in an atmosphere containing an oxidation gas, oxygen vacancies in the oxide semiconductor layers 106a and 106b can be reduced at the same time as the release of the impurities. The heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate detached oxygen.

[1-3-8. Planarization Treatment]

Then, planarization treatment is performed on the surface of the oxide semiconductor layer 106b, and parts of the oxide semiconductor layers 106a and 106b are removed to expose the surface of the insulating layer 105 (see FIG. 4B). In this embodiment, planarization treatment is performed using CMP treatment. At this time, part of the insulating layer 105 is also removed. In particular, the insulating layer 105 over the electrode 121 projects from the vicinity, thereby being easily formed to be thin by the planarization treatment. Thus, the planarization treatment is performed carefully not to exposure the surface of the electrode 121.

As the planarization treatment, in addition to polishing treatment such as CMP treatment, etching treatment or the like can be used. The planarization treatment in which CMP treatment and etching treatment are combined may be performed.

[1-3-9. Removal of Oxide Semiconductor Layer 106a and Oxide Semiconductor Layer 106b Over Trench 122]

Then, the oxide semiconductor layers 106a and 106b over the trench 122 are removed. First, a resist mask is formed to cover the trench 112.

Note that the removal of the oxide semiconductor layers 106a and 106b over the trench 122 may be performed by a dry etching method, a wet etching method, or both a dry etching method and a wet etching method. In the case where the oxide semiconductor layers 106a and 106b are etched by a wet etching method, a solution obtained by mixing phosphoric acid, acetic acid, and nitric acid, a solution containing oxalic acid, a solution containing phosphoric acid, or the like can be used as the etchant. Alternatively, ITO-07N (produced by KANTO CHEMICAL CO., INC.) may be used.

A chlorine-based gas typified by chlorine ($Cl_2$), boron trichloride ($BCl_3$), silicon tetrachloride ($SiCl_4$), carbon tetrachloride ($CCl_4$), or the like can be used as an etching gas for the dry etching of the oxide semiconductor layers 106a and 106b. As a plasma source in the case where the etching of the oxide semiconductor layers 106a and 106b is performed by a dry etching method, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, IMP, and SWP, a high density plasma can be generated. In the case of the etching according to the dry etching method (hereinafter also referred to as a "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

In this embodiment, the oxide semiconductor layers 106a and 106b over the trench 122 are removed by a wet etching method using a solution containing a phosphoric acid (see FIG. 5A).

[1-3-10. Formation of Source Electrode 107a, Drain Electrode 107b, and Electrode 127]

Next, a conductive layer for forming the source electrode 107a, the drain electrode 107b, and the electrode 127 (including other electrodes and wirings formed using the same layer) is formed over the insulating layer 105. In this embodiment, as the conductive layer, a 30-nm-thick tungsten layer is formed by a sputtering method.

Then, part of the conductive layer is selectively etched, using the resist mask, so that the source electrode 107a, the drain electrode 107b, and the electrode 127 (including other electrodes and wirings formed using the same layer) are formed. The etching of the conductive layer may be performed by a dry etching method, a wet etching method, or both a dry etching method and a wet etching method. After that, the resist mask is removed (see FIG. 5B).

Note that when a transistor having a very short channel length L is formed, the source electrode 107a and the drain electrode 107b may be formed in such a manner that the resist mask is formed by a method suitable for thin line processing, such as an electron beam exposure, extreme ultraviolet (EUV) exposure, or a liquid immersion exposure and then etching treatment is performed. Note that by the use of a positive type resist for the resist mask, the exposed region can be minimized and throughput can be thus improved. In the above manner, a transistor having a channel length of 30 nm or less can be formed.

It is preferable that the source electrode 107a, the drain electrode 107b, and the electrode 127 (including other electrodes and wirings formed using the same layer) each have an end portion having a tapered shaped. Specifically, the end portion has a taper angle θ of 80° or less, preferably 60° or less, further preferably 45° or less.

When the cross-section of each of the end portions of the source electrode 107a, the drain electrode 107b, and the electrode 127 (including other electrodes and wirings formed using the same layer) has a step-like shape including a plurality of steps, the coverage with a layer covering the source electrode 107a, the drain electrode 107b, and the electrode 127 can be improved. The above is not limited to the source electrode 107a, the drain electrode 107b, and the electrode 127, and by providing a forward taper shape or a step-like shape for a cross section of the end portion of each layer, a phenomenon in that a layer formed to cover the end portion is separated (disconnection) at the end portion can be prevented, so that the coverage becomes favorable.

[1-3-11. Formation of Oxide Semiconductor Layer 106c and Gate Insulating Layer 108]

Next, the oxide semiconductor layer 106c is formed in contact with the source electrode 107a, the drain electrode 107b, and part of the oxide semiconductor layer 106b, and the gate insulating layer 108 is formed over the oxide semiconductor layer 106c.

In this embodiment, like the oxide semiconductor layer 106a, a 10-nm-thick In—Ga—Zn oxide layer is formed as the oxide semiconductor layer 106c using a target containing In, Ga, and Zn at an atomic ratio of 1:3:4. As the gate insulating layer 108, a 20-nm-thick silicon oxynitride layer is formed by a plasma CVD method (see FIG. 6A).

As the silicon oxynitride layer, a silicon oxynitride layer whose defect density is low is preferably used. Specifically, a silicon oxynitride layer whose density of spins corresponding to a signal with a g factor of 2.001 in ESR is less than or equal to $3\times10^{17}$ spins/cm$^3$, preferably less than or equal to $5\times10^{16}$ spins/cm$^3$ is preferably used.

In addition, oxygen doping treatment is performed on the gate insulating layer 108, whereby the gate insulating layer 108 may be an insulating layer containing excess oxygen.

[1-3-12. Formation of Gate Electrode 109]

Next, a conductive layer for forming the gate electrode 109 is formed. Here, the conductive layer is a stack of titanium nitride and tungsten. Specifically, a 30-nm-thick titanium nitride layer is formed over the gate insulating layer 108 by a sputtering method and a 135-nm-thick tungsten layer is formed over the titanium nitride layer by a sputtering method.

Then, part of the conductive layer is selectively etched using a resist mask, so that the gate electrode 109 (including other electrodes and other wirings formed in the same layer) is formed. The etching of the conductive layer may be performed by a dry etching method, a wet etching method, or both a dry etching method and a wet etching method.

Then, part of the gate insulating layer 108 and part of the oxide semiconductor layer 106c are selectively removed using the gate electrode 109 as a mask. Thus, the side surfaces of the gate electrode 109, the gate insulating layer 108, and the oxide semiconductor layer 106c are substantially aligned with each other (see FIG. 6B). Note that the gate insulating layer 108 and the oxide semiconductor layer 106c may be selectively removed after the formation of the gate electrode 107 and before the removal of the resist mask.

At the time of etching for forming the gate electrode 109, the gate insulating layer 108 and the oxide semiconductor layer 106c may be selectively and successively removed. When the gate insulating layer 108 and the oxide semiconductor layer 106c in a region not overlapping with the gate electrode 109 are removed, an increase in leakage current between adjacent wirings due to a decrease in resistance value of the oxide semiconductor layer 106c by oxygen vacancies unintentionally formed in the oxide semiconductor layer 106c can be suppressed.

Note that in the case where the increase in leakage current can be ignored, in order to reduce manufacturing steps, the gate insulating layer 108 and the oxide semiconductor layer 106c in a region not overlapping the gate electrode 109 may remain without being removed.

[1-3-13. Formation of Insulating Layer 110 and Insulating Layer 111]

Next, the insulating layer 110 is formed over the gate electrode 109, the source electrode 107a, the drain electrode 107b, and the electrode 127, and the insulating layer 111 is formed over the insulating layer 110. In this embodiment, a 20-nm-thick aluminum oxide layer is formed as the insulating layer 110 by a sputtering method. As the insulating layer 111, a 150-nm-thick silicon oxynitride layer is formed by a plasma CVD method (see FIG. 7A).

The insulating layers 110 and 111 preferably have excess oxygen. Furthermore, the concentration of hydrogen in each of the insulating layers 110 and 111 is preferably lower than $5\times10^{19}$ cm$^{-3}$, further preferably lower than $5\times10^{18}$ cm$^{-3}$.

Thus, the insulating layer 110 may contain excess oxygen by performing oxygen doping treatment on the insulating layer 110. Furthermore, the insulating layer 111 may contain excess oxygen by performing oxygen doping treatment on the insulating layer 111.

Moreover, openings are formed in the insulating layers 110 and 111, and the electrode 127 electrically connected to the source electrode 107a, an electrode 128 electrically connected to the drain electrode 107b, and an electrode 129 electrically connected to the electrode 127 may be provided (see FIG. 7B).

In the transistor 100 described in this embodiment, the insulating layer 110 formed using aluminum oxide is provided over the gate electrode 109. In addition, the insulating layer 110 is in contact with the insulating layer 105 formed using the aluminum oxide in the peripheral portion of the transistor 100. Thus, the transistor 100 in this embodiment has a structure in which the oxide semiconductor layer 106 is covered with the aluminum oxide.

The aluminum oxide has a high oxygen barrier property. Furthermore, the aluminum oxide has a high barrier property against impurities such as hydrogen and moisture. Thus, entry of impurities such as hydrogen and moisture into the oxide semiconductor layer 106 from the outside can be prevented. Moreover, diffusion of oxygen in the oxide semiconductor layer 106 to the outside can be prevented.

The aluminum oxide used for the insulating layer 110 preferably contains excess oxygen. Furthermore, the concentration of hydrogen in the aluminum oxide is preferably lower than $5 \times 10^{19}$ cm$^{-3}$, further preferably lower than $5 \times 10^{18}$ cm$^{-3}$.

According to one embodiment of the present invention, a transistor having favorable electrical characteristics and high reliability can be obtained. Moreover, a semiconductor device having favorable electrical characteristics and high reliability can be obtained.

Although the variety of films such as the metal film, the semiconductor film, and the insulating film which are described in this specification can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the insulating film which have been disclosed in the embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. The material of the In—Ga—Zn—O film is not limited to the above combination, and triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

For example, in the case where a hafnium oxide film is formed by a deposition apparatus using an ALD method, two kinds of gases, i.e., ozone (O$_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed by a deposition apparatus using an ALD method, two kinds of gases, e.g., H$_2$O as an oxidizer and a source gas which is obtained by vaporizing liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidation gas (e.g., O$_2$ or dinitrogen monoxide) are supplied to react with the adsorbate.

For example, in the case where a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are introduced at a time, so that a tungsten film is formed. Note that an SiH$_4$ gas may be used instead of a B$_2$H$_6$ gas.

For example, in the case where an oxide semiconductor layer, e.g., an In—Ga—Zn—O layer is formed using a deposition apparatus employing ALD, an In(CH$_3$)$_3$ gas and an O$_3$ gas are sequentially introduced plural times to form an In—O layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of any of these gases. Note that although an H$_2$O gas which is obtained by bubbling with an inert gas such as Ar may be used instead of an O$_3$ gas, it is preferable to use an O$_3$ gas, which does not contain H. Furthermore, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, instead of an In(CH$_3$)$_3$ gas, an In(C$_2$H$_5$)$_3$ gas may be used. Furthermore, a Zn(CH$_3$)$_2$ gas may be used.

[1-4. Energy Band Structure of Oxide Semiconductor Layer]

Figure 13:
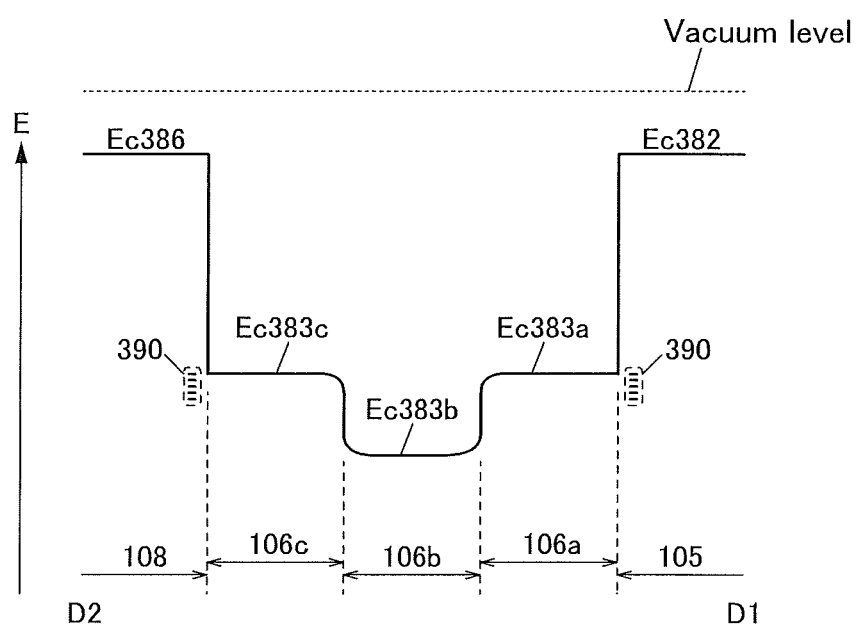
FIG. 13 shows an energy band structure.

Here, a function and an effect of the oxide semiconductor layer 106 in which the oxide semiconductor layers 106a, 106b, and 106c are stacked are described with reference to an energy band structure diagram of FIG. 13. FIG. 13 shows the energy band structure along a dashed-dotted line D1-D2 in FIG. 1C. Thus, FIG. 13 illustrates the energy band structure of a channel formation region of the transistor 100.

In FIG. 13, Ec382, Ec383a, Ec383b, Ec383c, and Ec386 are the energies of bottoms of the conduction band in the insulating layer 105, the oxide semiconductor layer 106a, the oxide semiconductor layer 106b, the oxide semiconductor layer 106c, and the gate insulating layer 108, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON SAS.). Furthermore, the difference in energy between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 105 and the gate insulating layer 108 are insulators, Ec382 and Ec386 are closer to the vacuum level (have a smaller electron affinity) than Ec383a, Ec383b, and Ec383c.

Furthermore, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Furthermore, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the oxide semiconductor layers 106a and 106b and the vicinity of the interface between the oxide semiconductor layers 106b and 106c, mixed regions are formed; thus, the energy of the bottom of the conduction band continuously changes. In other words, no state or few states exist at these interfaces.

Accordingly, electrons transfer mainly through the oxide semiconductor layer 106b in the stacked-layer structure having the above energy band structure. Therefore, even when an interface state exists at an interface between the oxide semiconductor layer 106a and the insulating layer 105 or an interface between the oxide semiconductor layer 106c and the gate insulating layer 108, the interface state hardly influences the transfer of the electrons. In addition, since no interface state or few interface states exist at an interface between the oxide semiconductor layer 106a and the oxide semiconductor layer 106b and an interface between the oxide semiconductor layer 106c and the oxide semiconductor layer 106b, the transfer of electrons is not interrupted in the region. Accordingly, high field-effect mobility can be obtained in the transistor 100 having the above stacked-layer structure of the oxide semiconductor layers.

Note that although trap states 390 due to impurities or defects might be formed in the vicinity of the interface between the oxide semiconductor layer 106a and the insulating layer 105 and in the vicinity of the interface between the oxide semiconductor layer 106c and the gate insulating layer 108 as illustrated in FIG. 13, the oxide semiconductor layer 106b can be separated from the trap states owing to the existence of the oxide semiconductor layer 106a and the oxide semiconductor layer 106c.

In the transistor 100 described in this embodiment, in a direction perpendicular to the channel length direction, the side surfaces and the bottom surface of the oxide semiconductor layer 106b are in contact with the oxide semiconductor layer 106a, and the top surface of the oxide semiconductor layer 106b is in contact with the oxide semiconductor layer 106c (see FIG. 1C). In this manner, the oxide semiconductor layer 106b is surrounded by the oxide semiconductor layers 106a and 106c, whereby the influence of the trap level can be further reduced.

However, in the case where an energy difference between Ec383a or Ec383c and Ec383b is small, electrons in the oxide semiconductor layer 123b might reach the trap state by passing over the energy gap. Since the electron is trapped at the trap state, a negative fixed charge is generated at the interface with the insulating film, causing the threshold voltage of the transistor to be shifted in the positive direction.

Therefore, each of the energy differences between Ec383a and Ec383b and between Ec383c and Ec383b is preferably set to be larger than or equal to 0.1 eV, further preferably larger than or equal to 0.15 eV, in which case a change in the threshold voltage of the transistor can be reduced and the transistor can have favorable electrical characteristics.

The band gap of each of the oxide semiconductor layer 106a and the oxide semiconductor layer 106c is preferably wider than that of the oxide semiconductor layer 106b.

There is no particular limitation on the structure of the transistor disclosed in this specification and the like. For example, a top-gate structure in which the gate electrode 103 is not provided or a bottom-gate structure in which the gate electrode 109 is not provided can be used. Furthermore, the transistor may have a single-gate structure including one channel formation region, a double-gate structure including two channel formation regions, or a triple-gate structure including three channel formation regions.

According to one embodiment of the present invention, a semiconductor device which can be miniaturized or highly integrated can be obtained. According to one embodiment of the present invention, a semiconductor device with favorable electrical characteristics can be obtained. According to one embodiment of the present invention, a semiconductor device with high reliability can be obtained.

This embodiment can be implemented in an appropriate combination with any of the structures described in the other embodiments.

Embodiment 2

In this embodiment, a transistor 200 having a structure different from that of the transistor 100 is shown as an example.

[2-1. Structural Example of Semiconductor Device]

Figure 8C:
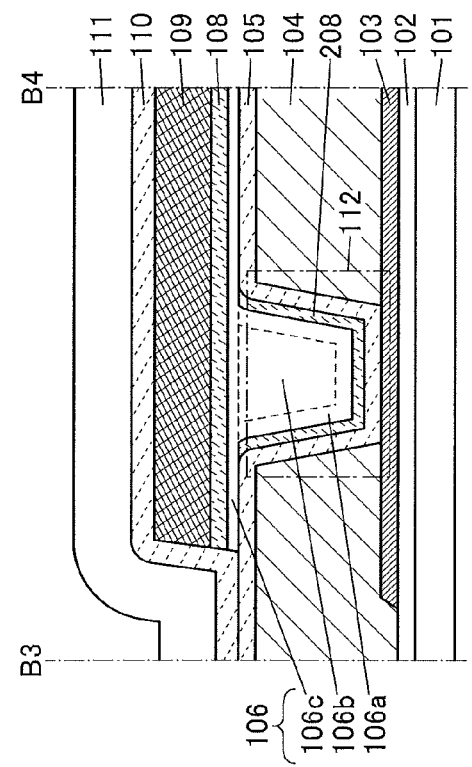
FIGS. 8A to 8C illustrate a structural example of a transistor.
Figure 8A:
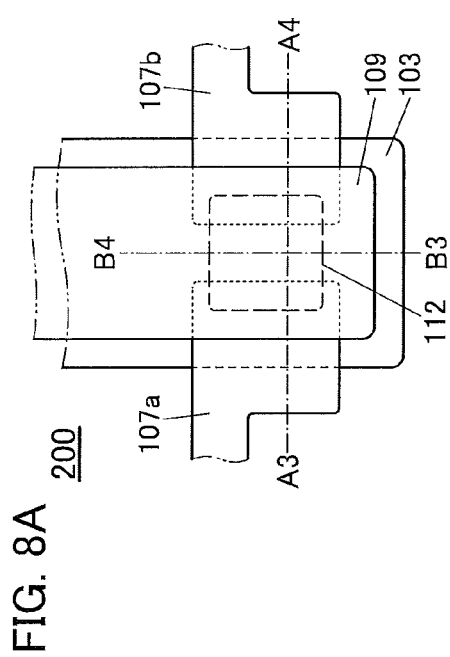
Figure 8B:
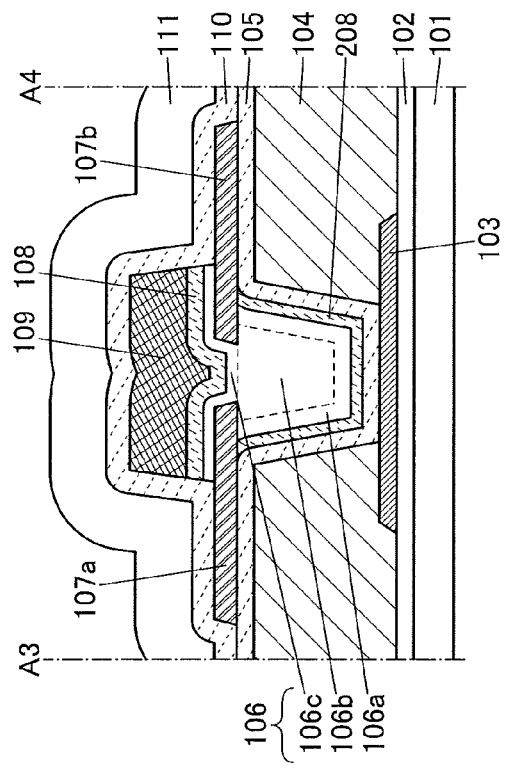

FIGS. 8A to 8C illustrate the transistor 200 of one embodiment of the present invention. FIG. 8A is a top view of the transistor 200. FIG. 8B is a cross-sectional view of a portion denoted by a dashed-dotted line A3-A4 in FIG. 8A, and FIG. 8C is a cross-sectional view of a portion denoted by a dashed-dotted line B3-B4 in FIG. 8A.

The transistor 200 has substantially the same structure as the transistor 100 but is different from the transistor 100 in that, in a cross-sectional structure, an insulating layer 208 is provided between the oxide semiconductor layer 106a and the insulating layer 105.

As the insulating layer 208, a silicon oxide layer or a silicon oxynitride layer with a low defect density is preferably used. Specifically, a silicon oxide layer or a silicon oxynitride layer whose density of spins corresponding to a signal with a g factor of 2.001 in ESR is lower than or equal to $3 \times 10^{17}$ spins/cm$^3$, preferably lower than or equal to $5 \times 10^{16}$ spins/cm$^3$ is preferably used.

For the insulating layer 208, silicon oxide containing excess oxygen or silicon oxynitride containing excess oxygen is preferably used. The insulating layer 208 containing excess oxygen is provided between the oxide semiconductor layer 106a and the insulating layer 105, whereby an effect of reducing oxygen vacancies in the oxide semiconductor layers 106a, 106b, and 106c can be increased. In particular, oxygen vacancies in the oxide semiconductor layer 106b are unlikely to be generated. According to one embodiment of the present invention, a transistor having favorable electrical characteristics and high reliability can be obtained. Moreover, according to one embodiment of the present invention, a semiconductor device having favorable electrical characteristics and high reliability can be obtained.

[2-2. Example of Method for Manufacturing Semiconductor Device]

To avoid repeated description, differences between the method for manufacturing the transistor 100 described in Embodiment 1 and the method for manufacturing the transistor 200 are described.

After the formation of the insulating layer 105, the insulating layer 208 containing excess oxygen is formed over the insulating layer 105. The insulating layer 208 can be formed using a material and a method similar to those of the insulating layer 102. The thickness of the insulating layer 208 may be greater than or equal to 10 nm and less than or equal to 500 nm, preferably greater than or equal to 50 nm and less than or equal to 300 nm. In this embodiment, a 20-nm-thick aluminum oxide layer is formed as the insulating layer 105 by a sputtering method, and then a 10-nm-thick silicon oxynitride layer is formed as the insulating layer 208 by a plasma CVD method.

After the formation of the insulating layer 208, oxygen doping treatment may be performed to increase excess oxygen in the insulating layer 208.

Then, the oxide semiconductor layer 106a is formed by a sputtering method. The subsequent steps are similar to those in the method for manufacturing the transistor 100, whereby the transistor 200 can be manufactured.

This embodiment can be implemented in an appropriate combination with any of the structures described in the other embodiments.

Embodiment 3

In this embodiment, a transistor 300 having a structure different from that of the transistor 100 is shown as an example.

[3-1. Structural Example of Semiconductor Device]

Figure 9C:
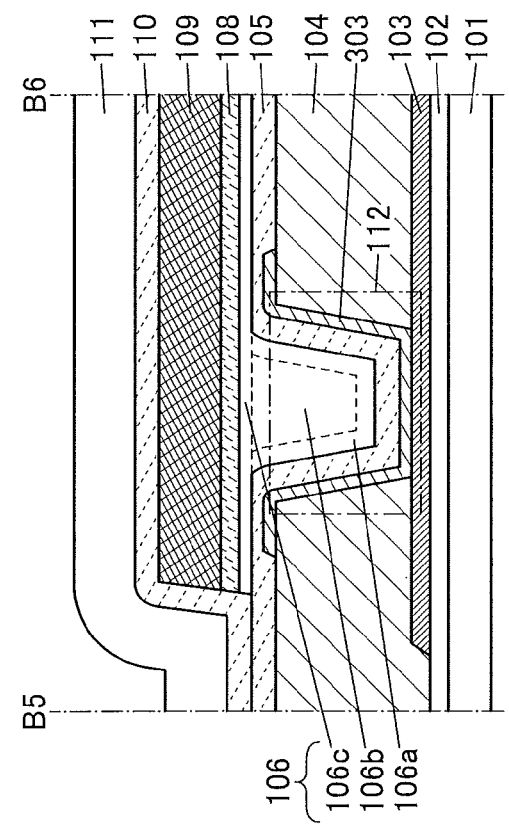
FIGS. 9A to 9C illustrate a structural example of a transistor.
Figure 9A:
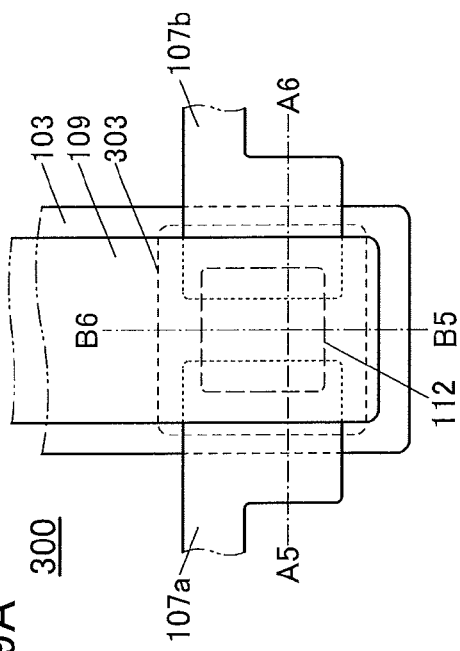
Figure 9B:
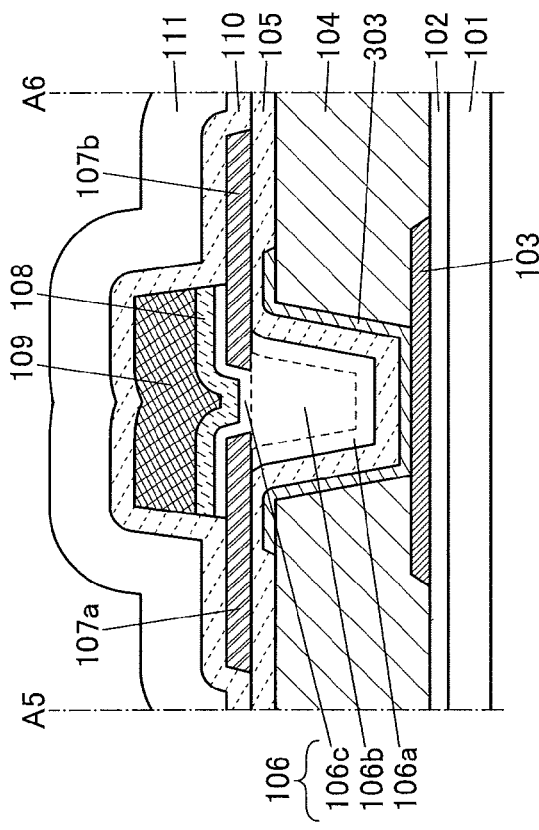

FIGS. 9A to 9C illustrate the transistor 300 of one embodiment of the present invention. FIG. 9A is a top view of the transistor 300. FIG. 9B is a cross-sectional view of a portion denoted by a dashed-dotted line A5-A6 in FIG. 9A, and FIG. 9C is a cross-sectional view of a portion denoted by a dashed-dotted line B5-B6 in FIG. 9A.

The transistor 300 has substantially the same structure as the transistor 100 but is different from the transistor 100 in that, in a cross-sectional structure, an electrode 303 is provided. The electrode 303 is formed along the side surfaces of the trench 112 and is electrically connected to the gate electrode 103 at the bottom surface of the trench 112. Furthermore, the electrode 303 overlaps with the oxide semiconductor layers 106a and 106b with the insulating layer 105 provided therebetween.

The electrode 303 serves as a gate electrode. In the transistor 100, an electric field with an intensity corresponding to the potential of the gate electrode 103 is applied to the oxide semiconductor layer 106b from the bottom surface of the trench 112. However, in the transistor 300, an electric field is applied not only from the bottom surface of the trench 112 but also from the side surfaces of the trench 112 through the electrode 303. Thus, more carriers can be induced rapidly in the bulk of the oxide semiconductor layer 106b in the transistor 300 compared to the transistor 100. According to one embodiment of the present invention, a transistor having favorable electrical characteristics and high reliability can be obtained. Moreover, according to one embodiment of the present invention, a semiconductor device having favorable electrical characteristics and high reliability can be obtained.

[3-2. Example of Method for Manufacturing Semiconductor Device]

In order to avoid repeated description, differences between the method for manufacturing the transistor 100 described in Embodiment 1 and the method for manufacturing the transistor 300 are described.

The electrode 303 can be formed using a material and a method similar to those of the electrode 121 at the same time as the formation of the electrode 121.

This embodiment can be implemented in an appropriate combination with any of the structures described in the other embodiments.

Embodiment 4

In this embodiment, a transistor 400 and a transistor 500 each having a structure different from that of the transistor 300 are shown as examples.

[4-1. Structural Example of Semiconductor Device]

Figure 10A:
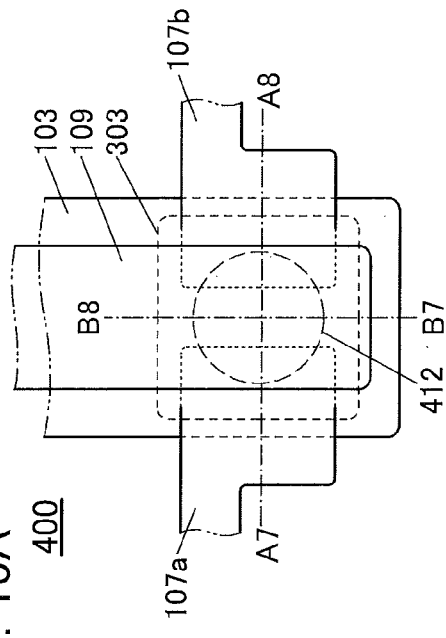
FIGS. 10A to 10C illustrate a structural example of a transistor.
Figure 10C:
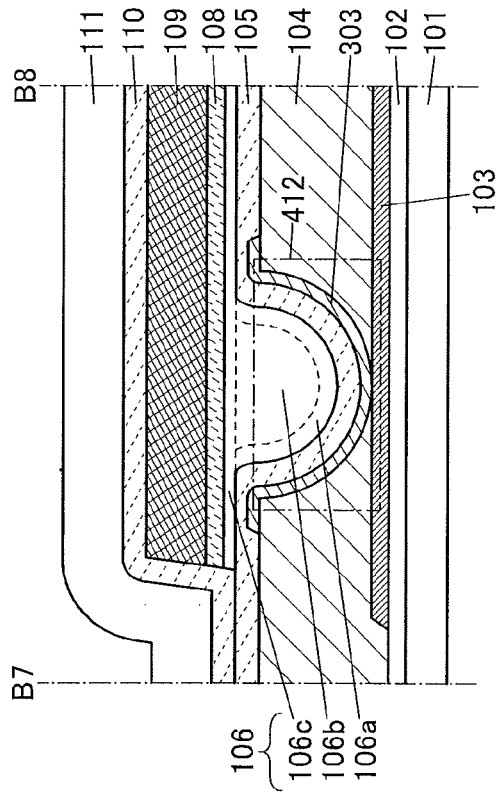
Figure 10B:
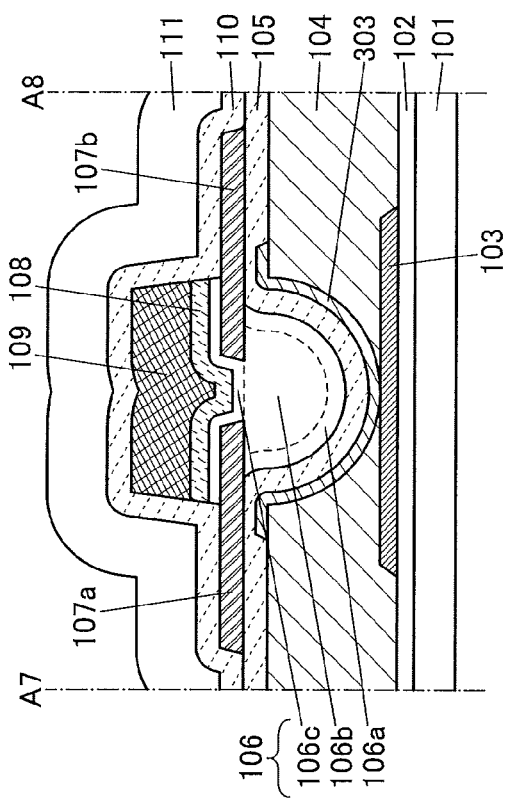

FIGS. 10A to 10C illustrate the transistor 400 of one embodiment of the present invention. FIG. 10A is a top view of the transistor 400. FIG. 10B is a cross-sectional view of a portion denoted by a dashed-dotted line A7-A8 in FIG. 10A, and FIG. 10C is a cross-sectional view of a portion denoted by a dashed-dotted line B7-B8 in FIG. 10A.

Figure 11C:
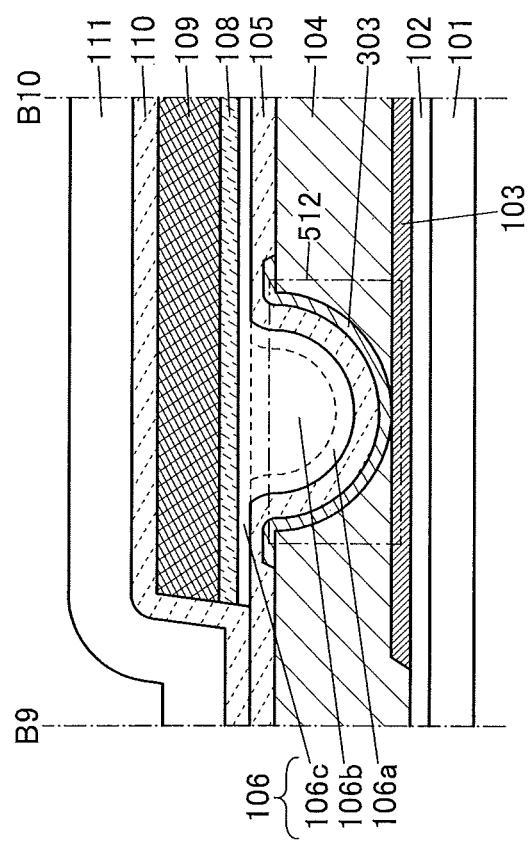
FIGS. 11A to 11C illustrate a structural example of a transistor.
Figure 11A:
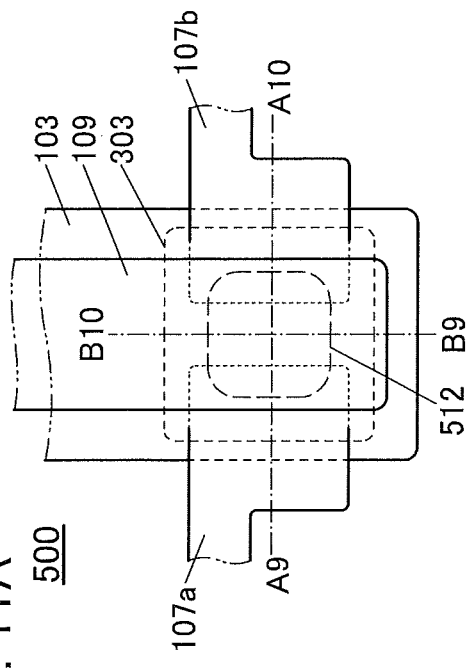
Figure 11B:
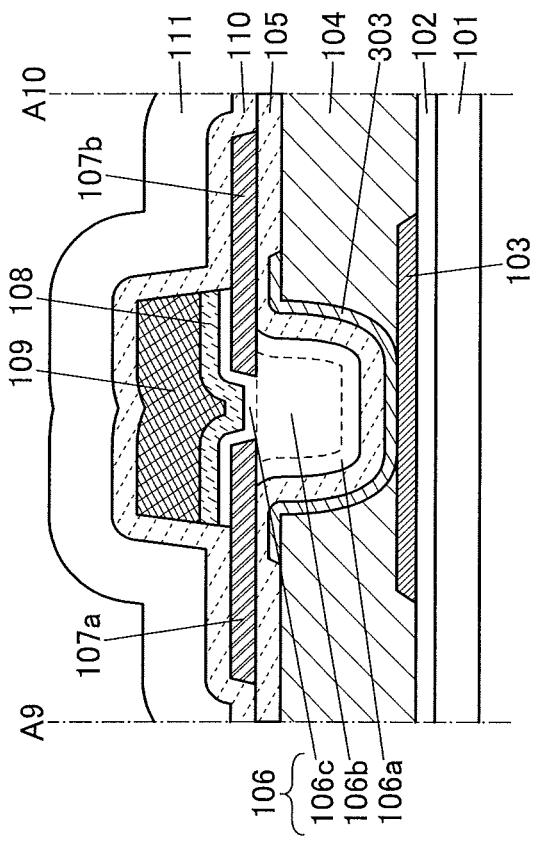

FIGS. 11A to 11C illustrate the transistor 500 of one embodiment of the present invention. FIG. 11A is a top view of the transistor 500. FIG. 11B is a cross-sectional view of a portion denoted by a dashed-dotted line A9-A10 in FIG. 11A, and FIG. 11C is a cross-sectional view of a portion denoted by a dashed-dotted line B9-B10 in FIG. 11A.

The transistor 400 has substantially the same structure as the transistor 300 but is different from the transistor 300 in the shape of the trench. The inside of a trench 412 included in the transistor 400 has a curved surface. Although the case where the trench 412 is depressed into a hemispherical shape in FIGS. 10A to 10C, the shape of the trench 412 is not limited thereto.

The shape of the oxide semiconductor layer 106 formed in the trench 412 reflects the shape of the trench 412; thus, the oxide semiconductor layer 106 also has a curved shape. In the oxide semiconductor layer 106 having a curved shape, the electric field of the electrode 303 easily reaches the bulk of the oxide semiconductor layer 106 uniformly; thus, electric-field concentration in the bulk is relieved and the reliability of the transistor 400 can be high. Furthermore, the electric field of the electrode 303 easily reaches the bulk of the oxide semiconductor layer 106 uniformly; thus, carriers can be generated efficiently when the transistor 400 is on and electrical characteristics of the transistor 400 can be favorable.

[4-2. Example of Method for Manufacturing Semiconductor Device]

The transistor 400 can be manufactured in a manner similar to that of the transistor 300. The trench 412 may be formed by either dry etching or wet etching, or by both dry etching and wet etching in a manner similar to that of the trench 112. Note that the shape of the trench can be adjusted depending on the shape of a resist mask for forming the trench, the etching rate in the depth direction, and the etching rate in the lateral direction.

Alternatively, like a trench 512 included in the transistor 500 in FIGS. 11A to 11C, the curvature of the curve of the cross section in the channel length direction may be different from that of the cross section in the channel width direction.

The trench 412 in this embodiment includes curved portions in both cross sections in the channel length direction and the channel width direction (see FIGS. 10B and 10C). However, the shape of the trench 412 is not limited thereto and may include a curve in either the cross section in the channel length direction or the cross section in the channel width direction.

This embodiment can be implemented in an appropriate combination with any of the structures described in the other embodiments.

Embodiment 5

In this embodiment, an example of a semiconductor device (memory device) which includes a transistor according to one embodiment of the present invention, which can hold stored data even when not powered, and which has an unlimited number of write cycles will be described with reference to drawings.

Figure 14A:
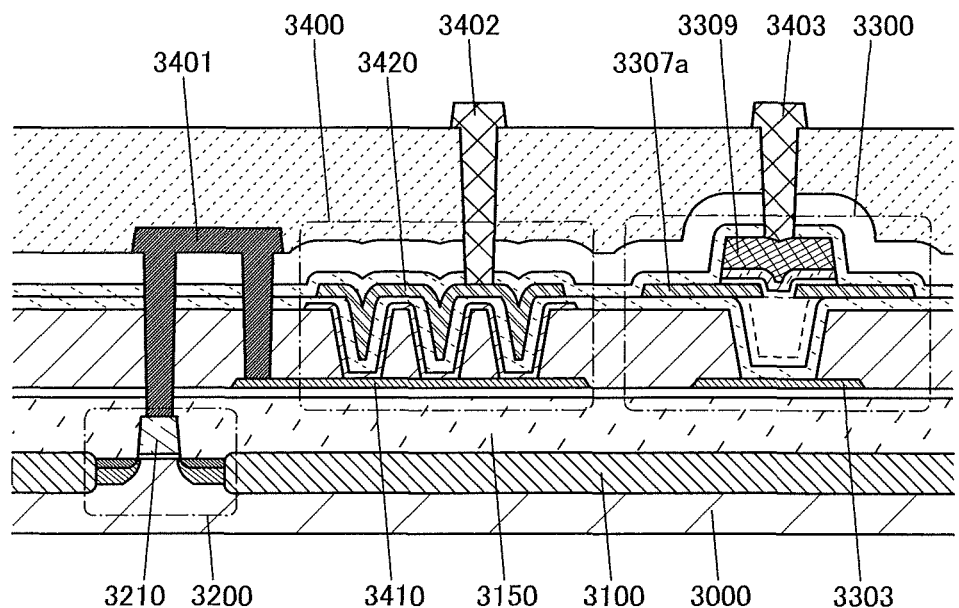
FIGS. 14A and 14B are a cross-sectional view and a circuit diagram illustrating one example of a semiconductor device.
Figure 14B:
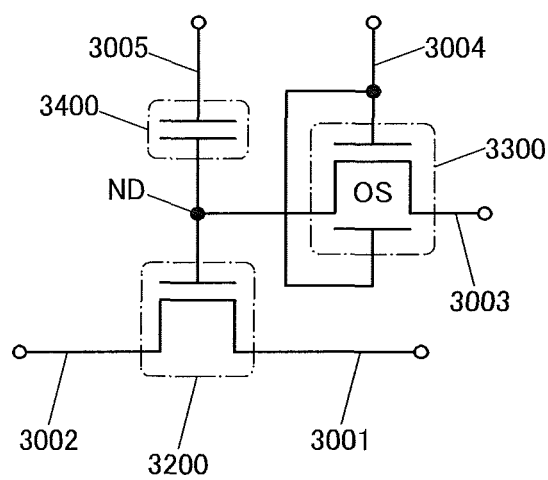

FIG. 14A is a cross-sectional view of the semiconductor device, and FIG. 14B is a circuit diagram of the semiconductor device.

The semiconductor device illustrated in FIGS. 14A and 14B includes a transistor 3200 including a first semiconductor material in a lower portion, and a transistor 3300 including a second semiconductor material and a capacitor 3400 in an upper portion. As the transistor 3300, any of the transistors described in Embodiments 1 to 4 can be used. As the capacitor 3400, the capacitor described in Embodiment 1 can be used. In the circuit diagram, "OS" is written beside a transistor in order to clearly demonstrate that the transistor 3300 includes an oxide semiconductor.

An electrode 3309 of the transistor 3300 is electrically connected to an electrode 3403. Furthermore, the electrode 3309 of the transistor 3300 is electrically connected to a gate electrode 3303 (not illustrated). Furthermore, a source electrode 3307a of the transistor 3300 is electrically connected to a gate electrode 3210 of the transistor 3200 (not illustrated).

An electrode 3410 of the capacitor 3400 is electrically connected to the gate electrode 3210 of the transistor 3200 through the electrode 3401. Furthermore, an electrode 3420 of the capacitor 3400 is electrically connected to an electrode 3402.

Here, the first semiconductor material and the second semiconductor material are preferably materials having different band gaps. For example, in the case where an oxide semiconductor is used as the second semiconductor material, a semiconductor material other than an oxide semiconductor is preferably used as the first semiconductor material. A transistor including a semiconductor material other than an oxide semiconductor, such as crystalline silicon, can operate at high speed more easily than a transistor including an oxide semiconductor. On the other hand, a transistor including an oxide semiconductor enables charge to be held for a long time owing to its electrical characteristics, that is, the low off-state current.

Although both of the above transistors are n-channel transistors in the following description, it is needless to say that p-channel transistors can be used. Note that unless otherwise specified, the specific structure of the semiconductor device, such as a material used for the semiconductor device and the structure of the semiconductor device, needs not to be limited to that described here.

The transistor 3200 in FIG. 14A includes a channel formation region provided in a substrate 3000 containing a semiconductor material (such as crystalline silicon), impurity regions provided such that the channel formation region is provided therebetween, intermetallic compound regions in contact with the impurity regions, a gate insulating film provided over the channel formation region, and a gate electrode provided over the gate insulating film. Note that a transistor whose source electrode and drain electrode are not illustrated in a drawing may also be referred to as a transistor for the sake of convenience. Furthermore, in such a case, in description of a connection of a transistor, a source region and a source electrode may be collectively referred to as a source electrode, and a drain region and a drain electrode may be collectively referred to as a drain electrode. That is, in this specification, the term "source electrode" might include a source region.

An element isolation insulating layer 3100 is formed on the substrate 3000 so as to surround the transistor 3200, and an insulating layer 3150 is formed so as to cover the transistor 3200. Note that the element isolation insulating layer 3100 can be formed by an element isolation technique such as local oxidation of silicon (LOCOS) or shallow trench isolation (S11).

In the case where the transistor 3200 is formed using a crystalline silicon substrate, for example, the transistor 3200 can operate at high speed. Thus, when the transistor is used as a reading transistor, data can be read at high speed.

The transistor 3300 in FIG. 14A is a transistor in which a channel is formed in an oxide semiconductor layer. Since the off-state current of the transistor 3300 is low, stored data can be retained for a long period owing to such a transistor. In other words, refresh operation becomes unnecessary or the frequency of the refresh operation in a semiconductor storage device can be extremely low, which leads to a sufficient reduction in power consumption.

The transistor 3300 and the capacitor 3400 can be formed over the substrate over which the transistor 3200 is formed as illustrated in FIG. 14A, which enables the degree of the integration of the semiconductor device to be increased.

An example of a circuit configuration corresponding to FIG. 14A is illustrated in FIG. 14B.

In FIG. 14B, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. The gate electrode of the transistor 3200, the other of the source electrode and the drain electrode of the transistor 3300, and the one electrode of the capacitor 3400 are electrically connected to a node ND. A fifth wiring 3005 is electrically connected to the other electrode of the capacitor 3400.

A transistor including an oxide semiconductor in a semiconductor layer in which a channel is formed has an extremely small off-state current. The transistor including an oxide semiconductor in a semiconductor layer in which a channel is formed is used as the transistor 3300, whereby electric charge in the node ND can be retained for a long time. Thus, electric charge in the gate electrode of the transistor 3200 can be retained for a long time.

The semiconductor device in FIG. 14B utilizes a feature that the electric charge in the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in general, in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Thus, the data retained in the gate electrode can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film does not occur. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

As described above, a miniaturized and highly integrated semiconductor device having high electrical characteristics can be provided.

This embodiment can be combined with any of the other embodiments in this specification as appropriate.

Embodiment 6

In this embodiment, a semiconductor device including the transistor of one embodiment of the present invention, which can retain stored data even when not powered, which does not have a limit on the number of write cycles, and which has a structure different from that described in Embodiment 5, is described.

Figure 15:
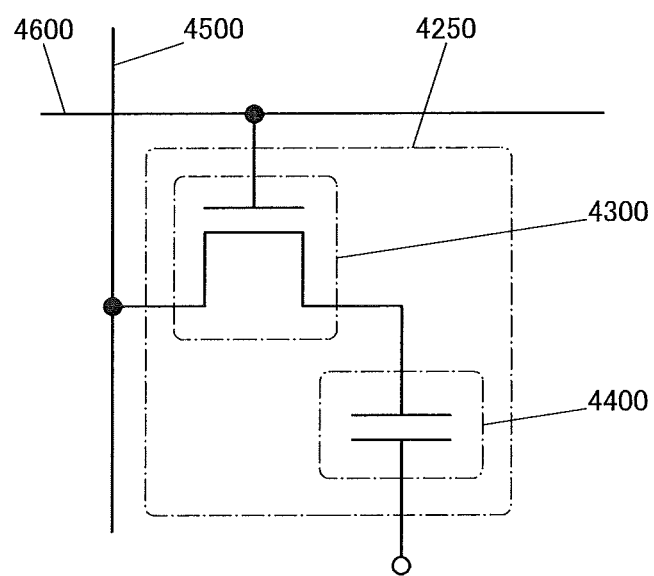
FIG. 15 is a circuit diagram illustrating one example of a semiconductor device.

FIG. 15 illustrates an example of a circuit configuration of the semiconductor device. In the semiconductor device, a first wiring 4500 is electrically connected to a source electrode of a transistor 4300, a second wiring 4600 is electrically connected to a gate electrode of the transistor 4300, and a drain electrode of the transistor 4300 is electrically connected to one terminal of a capacitor 4400. Note that any of the transistors described in Embodiments 1 to 4 can be used as the transistor 4300 included in the semiconductor device. As the capacitor 4400, the capacitor described in Embodiment 1 can be used. The first wiring 4500 can serve as a bit line and the second wiring 4600 can serve as a word line.

The semiconductor device (a memory cell 4250) can have a connection mode similar to that of the transistor 3300 and the capacitor 3400 illustrated in FIGS. 14A and 14B. Thus, the capacitor 4400 can be formed in the same process and at the same time as the transistor 4300 in a manner similar to that of the capacitor 3400 described in Embodiment 5.

Next, writing and retaining of data in the semiconductor device (the memory cell 4250) illustrated in FIG. 15 are described.

First, a potential at which the transistor 4300 is turned on is supplied to the second wiring 4600, so that the transistor 4300 is turned on. Accordingly, the potential of the first wiring 4500 is supplied to the one terminal of the capacitor 4400 (writing). After that, the potential of the second wiring 4600 is set to a potential at which the transistor 4300 is turned off, so that the transistor 4300 is turned off. Thus, the potential of the one terminal of the capacitor 4400 is retained (retaining).

The transistor 4300 including an oxide semiconductor has an extremely low off-state current. For that reason, the potential of the one terminal of the capacitor 4400 (or a charge accumulated in the capacitor 4400) can be retained for an extremely long time by turning off the transistor 4300.

Next, reading of data is described. When the transistor 4300 is turned on, the first wiring 4500 which is in a floating state and the capacitor 4400 are electrically connected to each other, and the charge is redistributed between the first wiring 4500 and the capacitor 4400. As a result, the potential of the first wiring 4500 is changed. The amount of change in potential of the first wiring 4500 varies depending on the potential of the one terminal of the capacitor 4400 (or the charge accumulated in the capacitor 4400).

For example, the potential of the first wiring 4500 after the charge redistribution is $(C_B \times V_{B0} + C \times V)/(C_B + C)$, where V is the potential of the one terminal of the capacitor 4400, C is the capacitance of the capacitor 4400, $C_B$ is the capacitance component of the first wiring 4500, and $V_{B0}$ is the potential of the first wiring 4500 before the charge redistribution. Thus, it can be found that, assuming that the memory cell 4250 is in either of two states in which the potential of the one terminal of the capacitor 4400 is $V_1$ and $V_0$ ($V_1 > V_0$), the potential of the first wiring 4500 in the case of retaining the potential $V_1$ ($=(C_B \times V_{B0} + C \times V_1)/(C_B + C)$) is higher than the potential of the first wiring 4500 in the case of retaining the potential $V_0$ ($=(C_B \times V_{B0} + C \times V_0)/(C_B + C)$).

Then, by comparing the potential of the first wiring 4500 with a predetermined potential, data can be read.

As described above, the semiconductor device (the memory cell 4250) illustrated in FIG. 15 can retain charge that is accumulated in the capacitor 4400 for a long time because the off-state current of the transistor 4300 is extremely low. In other words, refresh operation becomes unnecessary or the frequency of the refresh operation can be extremely low, which leads to a sufficient reduction in power consumption. Moreover, stored data can be retained for a long time even when power is not supplied.

A substrate over which a driver circuit for the memory cell 4250 is formed and the memory cell 4250 illustrated in FIG. 15 are preferably stacked. When the memory cell 4250 and the driver circuit are stacked, the size of the semiconductor device can be reduced. Note that there is no limitation on the numbers of the memory cells 4250 and the driver circuits which are stacked.

It is preferable that a semiconductor material of a transistor included in the driver circuit be different from that of the transistor 4300. For example, silicon, germanium, silicon germanium, silicon carbide, or gallium arsenide can be used, and a single crystal semiconductor is preferably used. A transistor formed using such a semiconductor material can operate at higher speed than a transistor formed using an oxide semiconductor and is suitable for the driver circuit for the memory cell 4250.

As described above, a miniaturized and highly integrated semiconductor device having high electrical characteristics can be provided.

This embodiment can be combined with any of the other embodiments in this specification as appropriate.

Embodiment 7

In this embodiment, an example of a semiconductor device including the transistor of one embodiment of the present invention will be described with reference to the drawings.

Figure 16A:
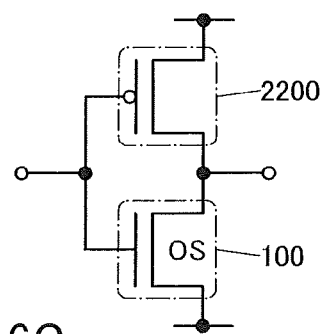
FIGS. 16A to 16D are circuit diagrams and cross-sectional views illustrating examples of a semiconductor device.
Figure 16B:
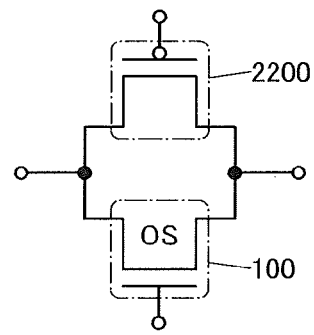
Figure 16C:
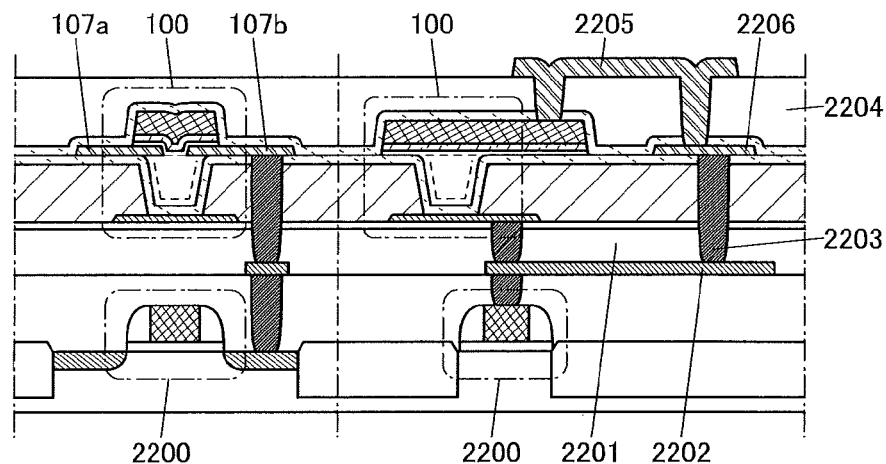
Figure 16D:
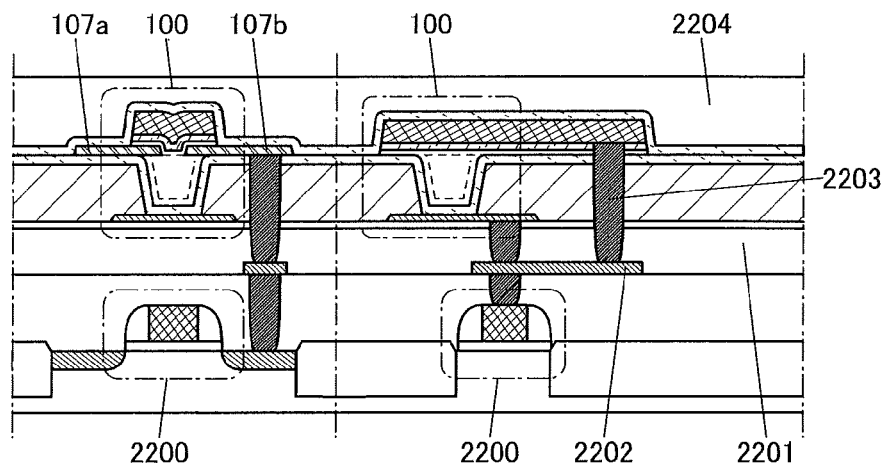

FIG. 16A is a circuit diagram of a semiconductor device and FIGS. 16C and 16D are each a cross-sectional view of a semiconductor device. FIGS. 16C and 16D each illustrate a cross-sectional view of a transistor 100 in a channel length direction on the left and a cross-sectional view of the transistor 100 in a direction perpendicular to the channel length direction on the right. In the circuit diagram, "OS" is written beside a transistor in order to clearly demonstrate that the transistor includes an oxide semiconductor.

The semiconductor devices illustrated in FIGS. 16C and 16D each include a transistor 2200 containing a first semiconductor material in a lower portion and a transistor containing a second semiconductor material in an upper portion. Here, an example is described in which the transistor 100 described in Embodiment 1 is used as the transistor containing the second semiconductor material.

Here, the first semiconductor material and the second semiconductor material preferably have different energy gaps. For example, the first semiconductor material may be a semiconductor material (e.g., silicon, germanium, silicon germanium, silicon carbide, or gallium arsenic) other than an oxide semiconductor, and the second semiconductor material may be the oxide semiconductor described in Embodiment 1. A transistor including single crystal silicon or the like as a material other than an oxide semiconductor can operate at high speed easily. In contrast, a transistor including an oxide semiconductor has the low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, needs not to be limited to that described here except for the use of the transistor described in Embodiment 1, which is formed using an oxide semiconductor.

FIGS. 16A, 16C, and 16D each illustrate a configuration example of what is called a CMOS circuit, in which a p-channel transistor and an n-channel transistor are connected in series and gates of the transistors are connected.

The circuit can operate at high speed because the transistor 100 of one embodiment of the present invention has high on-state current.

FIG. 16C illustrates a configuration in which the transistor 100 is provided over the transistor 2200 with an insulating layer 2201 provided therebetween. Furthermore, wirings 2202 are provided between the transistor 2200 and the transistor 100. Furthermore, wirings and electrodes provided in the upper portion and the lower portion are electrically connected to each other through a plurality of plugs 2203 embedded in insulating layers. Note that an insulating layer 2204 covering the transistor 100, a wiring 2205 over the insulating layer 2204, and a wiring 2206 formed by processing a conductive film that is also used for the source electrode 107a and the drain electrode 107b of the transistor are provided.

When two transistors are stacked as described above, the area occupied by the circuit can be reduced and a plurality of circuits can be arranged with higher density.

In FIG. 16C, the drain electrode 107b of the transistor 100 is electrically connected to one of a source and a drain of the transistor 2200 through the wirings 2202 and the plugs 2203. Furthermore, the gate of the transistor 100 is electrically connected to the gate of the transistor 2200 through the wiring 2205, the wiring 2206, the plugs 2203, the wiring 2202, and the like.

In the configuration illustrated in FIG. 16D, an opening portion in which the plug 2203 is embedded is provided in a gate insulating layer of the transistor 100, and the gate of the transistor 100 is in contact with the plug 2203 in the opening portion. Such a configuration makes it possible to achieve the integration of the circuit easily and to reduce the lengths and the number of wirings and plugs to be smaller than those in the configuration illustrated in FIG. 16C; thus, the circuit can operate at higher speed.

Note that when a connection between the electrodes of the transistor 100 and the transistor 2200 is changed from that in the configuration illustrated in FIG. 16C or FIG. 16D, a variety of circuits can be formed. For example, a circuit having a configuration in which a source and a drain of a transistor are connected to those of another transistor as illustrated in FIG. 16B can operate as what is called an analog switch.

This embodiment can be implemented in combination with any of the other embodiments described in this specification as appropriate.

Embodiment 8

In this embodiment, an example of a semiconductor device including the transistor of one embodiment of the present invention is described with reference to the drawings.

In the case of arranging a plurality of transistors over a substrate, the integration density of the transistors can be further increased by providing a trench not for each transistor but for a plurality of transistors.

Figure 17A:
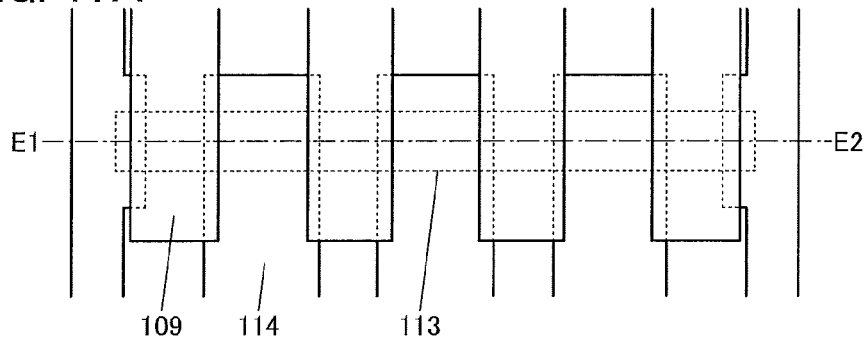
FIGS. 17A to 17D are a top view, a cross-sectional view, and circuit diagrams illustrating one example of a semiconductor device.
Figure 17B:
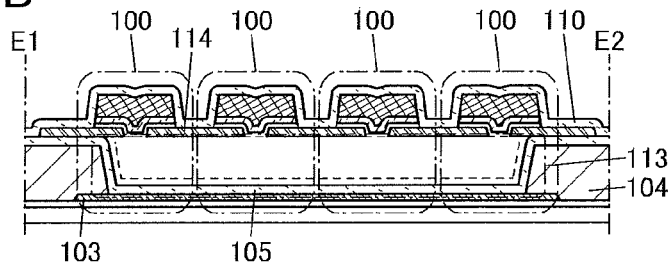

As an example, FIGS. 17A to 17D illustrate the case of forming four transistors 100, which are connected in series, in an upper portion of a trench provided in the insulating layer 104. FIG. 17A is a schematic top view and FIG. 17B is a cross-sectional view taken along dashed-dotted line E1-E2 in FIG. 17A.

As illustrated in FIG. 17B, the four transistors 100 are found in the upper portion of the trench 113 formed in the insulating layer 104. The two adjacent transistors 100 share an electrode 114; thus, the four transistors 100 are connected in series. The electrode 114 serves as a source electrode or a drain electrode of each of the transistors 100. On the other hand, the gate electrode 109 is provided for each of the transistors 100. In FIG. 17B, an example in which the four transistors 100 share one gate electrode 103 is shown. Note that the gate electrode 103 may be provided for each of the transistors 100.

The insulating layer 105 and the insulating layer 110 are provided to surround the four transistors 100 and in contact with each other outside the source electrode or the drain electrode of the transistor 100 provided over both ends of the trench.

Figure 17C:
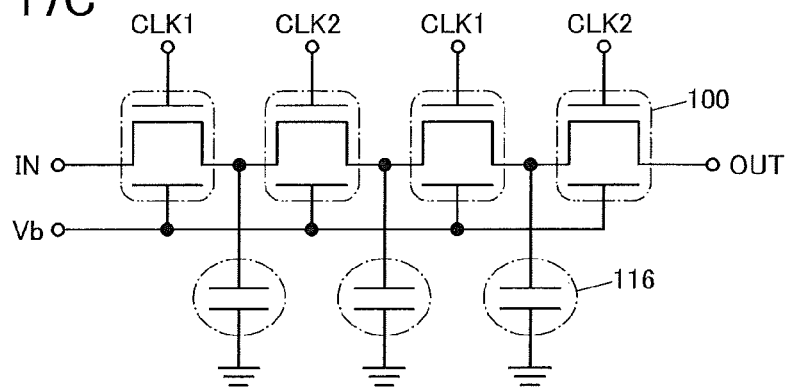

FIG. 17C illustrates an example of a circuit configuration which can be used for the transistors 100 connected in series as described above. A circuit illustrated in FIG. 17C includes the four transistors 100 and three capacitors 116. In the two adjacent transistors, a source or a drain of one of the transistors is electrically connected to a source or a drain of the other transistor to form a node, and one electrode of the capacitor 116 is electrically connected to the node. The capacitor described in Embodiment 1 can be referred to for the capacitor 116.

Furthermore, by supplying a bias potential Vb to the gate electrode 103, the threshold voltages of the four transistors 100 can be changed.

The circuit illustrated in FIG. 17C can serve as, for example, a shift register by application of a potential described below.

A common potential is applied to the other electrodes of the three capacitors 116. In the four transistors 100, a clock signal (CLK1) is applied to gates of the first and third transistors 100 from the left, and a clock signal (CLK2) is applied to gates of the second and fourth transistors 100 from the left. One of the source and the drain of the first transistor 100 is an input terminal to which an input potential (IN) is applied, and one of the source and the drain of the fourth transistor 100 is an output terminal from which an output potential (OUT) is output. As CLK1 and CLK2, clock signals having potentials with which transistors 100 are alternately turned on and are not in an on state in the same period (e.g., high-level potential) are used, which makes it possible to shift data of a potential applied to the input terminal from the left to the right.

Figure 17D:
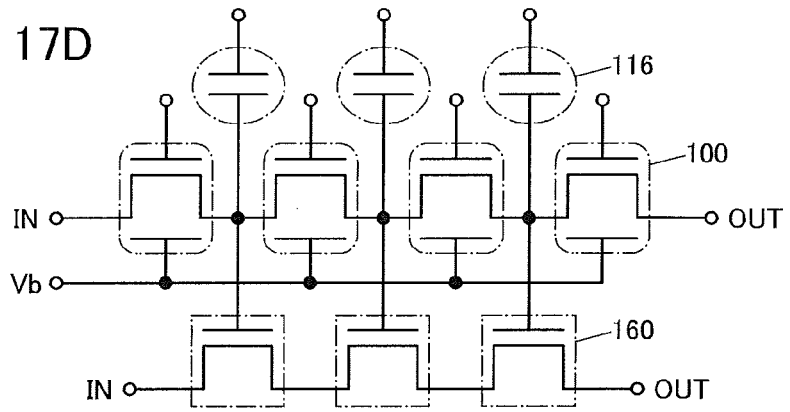

FIG. 17D illustrates a circuit configuration in which a plurality of reading transistors 160 connected in series are added to the circuit illustrated in FIG. 17C. Each of the gates of the transistors 160 is electrically connected to a node to which the one electrode of the capacitor 116 is connected. A reading potential is applied to each of the other electrodes of the capacitors 116. With such a structure, the circuit illustrated in FIG. 17D can serve as a NAND memory device that can read data of a potential held in the node connected to the one electrode of the capacitor 116 at any time. Here, the transistor 160 may be a transistor using an oxide semiconductor, which is similar to the transistor 100, or a transistor using a semiconductor having a different band gap from that of the transistor 100.

This embodiment can be implemented in combination with any of the other embodiments described in this specification as appropriate.

Embodiment 9

A semiconductor device having an image sensor function of reading information on an object can be manufactured using any of the transistors described in Embodiments 1 to 4.

Figure 18:
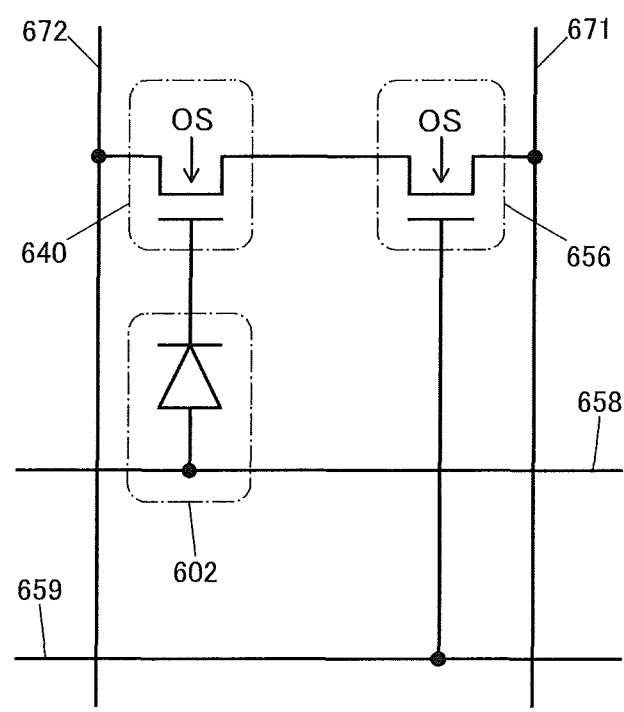
FIG. 18 is a circuit diagram illustrating one example of a semiconductor device.

FIG. 18 illustrates an example of an equivalent circuit of a semiconductor device having an image sensor function.

One electrode of a photodiode 602 is electrically connected to a photodiode reset signal line 658, and the other electrode is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

The photodiode 602 can be, for example, a pin photodiode in which a p-type semiconductor layer, a high-resistance (i-type) semiconductor layer, and an n-type semiconductor layer.

With detection of light that enters the photodiode 602, data of an object can be read. Note that a light source such as a backlight can be used at the time of reading data of an object.

Note that any of the transistors described in Embodiments 1 to 4, which includes a channel formed in an oxide semiconductor, can be used as the transistor 640 and the transistor 656. In FIG. 18, "OS" is written beside the transistors 640 and 656 so as to identify the transistors as including an oxide semiconductor.

Each of the transistors 640 and 656 is the one shown in the above embodiments, in which the oxide semiconductor layer including the channel is surrounded by the insulating layers including an aluminum oxide film containing excess oxygen. In addition, the oxide semiconductor layer is preferably electrically covered with the gate electrode layer. As a result, the transistors 640 and 656 have little variation in electrical characteristics and are electrically stable. With use of these transistors, the semiconductor device having an image sensor function illustrated in FIG. 18 can have high reliability.

This embodiment can be implemented in combination with any of the other embodiments described in this specification as appropriate.

Embodiment 10

In this embodiment, description is given of a CPU in which at least the transistor described in any of Embodiments 1 to 4 can be used and the memory device described in Embodiment 5 is included.

Figure 19:
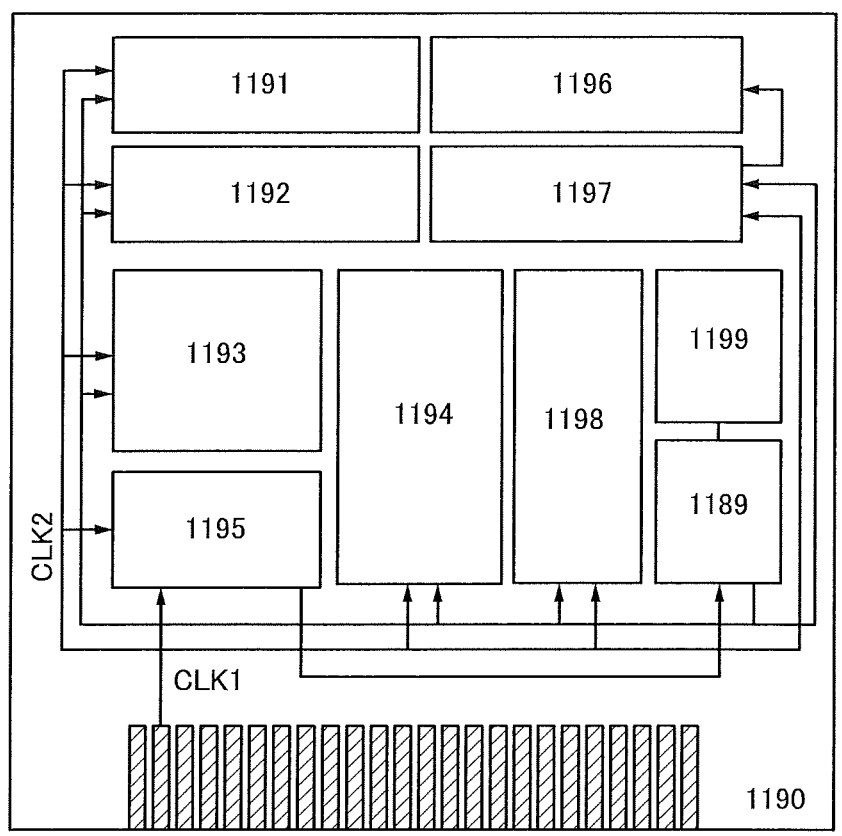
FIG. 19 is a block diagram illustrating one example of a semiconductor device.

FIG. 19 is a block diagram illustrating a configuration example of a CPU at least partly including any of the transistors described in Embodiments 1 to 4.

The CPU illustrated in FIG. 19 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface ROM I/F) 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 19 is just an example in which the configuration has been simplified, and an actual CPU may have various configurations depending on the application. For example, the CPU may have the following configuration: a structure including the CPU illustrated in FIG. 19 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 19, a memory cell is provided in the register 1196. As the memory cell of the register 1196, the transistor described in the above embodiment can be used.

In the CPU illustrated in FIG. 19, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 20:
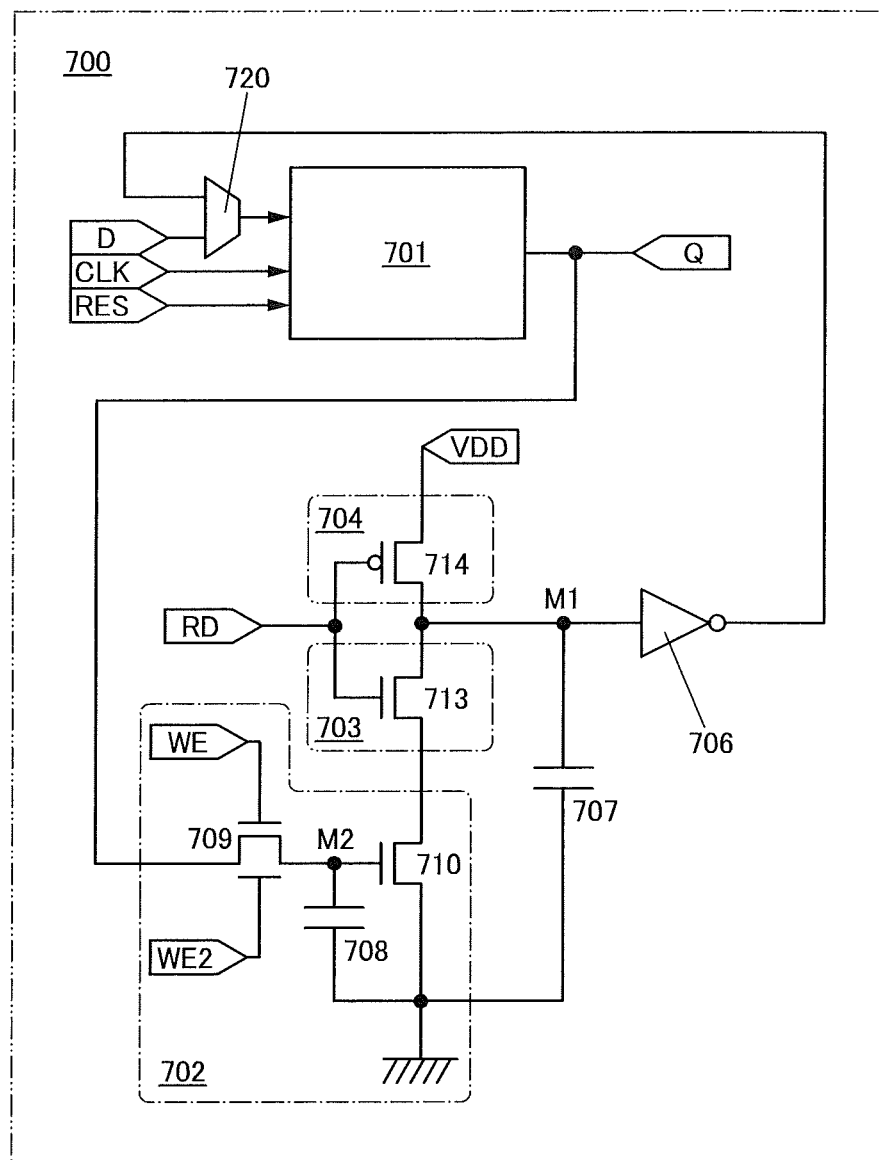
FIG. 20 is a circuit diagram illustrating one example of a memory device.

FIG. 20 is an example of a circuit diagram of a memory element that can be used as the register 1196. A memory element 700 includes a circuit 701 in which stored data is volatile when power supply is stopped, a circuit 702 in which stored data is nonvolatile even when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in Embodiment 5 can be used as the circuit 702. When supply of a power supply voltage to the memory element 700 is stopped, a ground potential (0 V) or a potential at which the transistor 709 in the circuit 702 is turned off continues to be input to a gate of the transistor 709. For example, the gate of the transistor 709 is grounded through a load such as a resistor.

Shown here is an example in which the switch 703 is a transistor 713 having one conductivity type (e.g., an n-channel transistor) and the switch 704 is a transistor 714 having a conductivity type opposite to the one conductivity type (e.g., a p-channel transistor). A first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. FIG. 20 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 20, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where the circuit 701 includes a node in which a signal obtained by inversion of the logic value of a signal input from the input terminal is retained, the signal output from the second terminal of the switch 703 (the other of the source and the drain of the transistor 713) can be input to the node.

As the transistor 709 in FIG. 20, any of the dual-gate transistors described in Embodiments 1 to 4 can be used. The control signal WE can be input to a first gate electrode and the control signal WE2 can be input to a second gate electrode. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 can be further reduced. Note that as the transistor 709, the transistor without the second gate electrode can be used.

In FIG. 20, the transistors included in the memory element 700 except for the transistor 709 can each be a transistor in which a channel is formed in a layer formed using a semiconductor other than an oxide semiconductor or in the substrate 1190. For example, a channel of transistor can be formed in a silicon layer or a silicon substrate. Alternatively, all the transistors in the memory element 700 may be a transistor in which a channel is formed in an oxide semiconductor layer. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 20, for example, a flip-flop circuit can be used. As the logic element 706, for example, an inverter or a clocked inverter can be used.

In a period during which the memory element 700 is not supplied with the power supply voltage, the semiconductor device of one embodiment of the present invention can retain data stored in the circuit 701 by the capacitor 708 which is provided in the circuit 702.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when such a transistor including an oxide semiconductor is used for the transistor 709, a signal held in the capacitor 708 is retained for a long time also in a period during which the power supply voltage is not supplied to the memory element 700. The memory element 700 can accordingly retain the stored content (data) also in a period during which the supply of the power supply voltage is stopped.

The memory element 700 performs pre-charge operation with the switch 703 and the switch 704, shortening the time required for the circuit 701 to retain original data again after the supply of the power supply voltage is restarted.

In the circuit 702, a signal retained by the capacitor 708 is input to the gate of the transistor 710. Therefore, after supply of the power supply voltage to the memory element 700 is restarted, the signal retained by the capacitor 708 can be converted into the one corresponding to the state (the on state or the off state) of the transistor 710 to be read from the circuit 702. Consequently, an original signal can be accurately read even when a potential corresponding to the signal retained by the capacitor 708 varies to some degree.

By applying the above-described memory element 700 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 700 is used in a CPU in this embodiment, the memory element 700 can also be used in an LSI such as a digital signal processor (DSP), a custom LSI, or a programmable logic device (PLD), and a radio frequency identification (RF-ID).

This embodiment can be combined with any of the other embodiments in this specification as appropriate.

Embodiment 11

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, medical equipment such as dialyzers, detectors detecting fire, smoke, electric leakage, gas leakage, or the like, and various sensors such as proximity sensors, infrared sensors, vibration sensors, radiation sensors, and human sensors. Furthermore, the examples include industrial equipment such as guide lights, traffic lights, belt conveyors, elevators, escalators, industrial robots, and power storage systems. In addition, moving objects driven by oil engines and electric motors using power from the non-aqueous secondary batteries, and the like are also included in the category of electric appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of the electronic appliances are illustrated in FIGS. 21A to 21C.

Figure 21A:
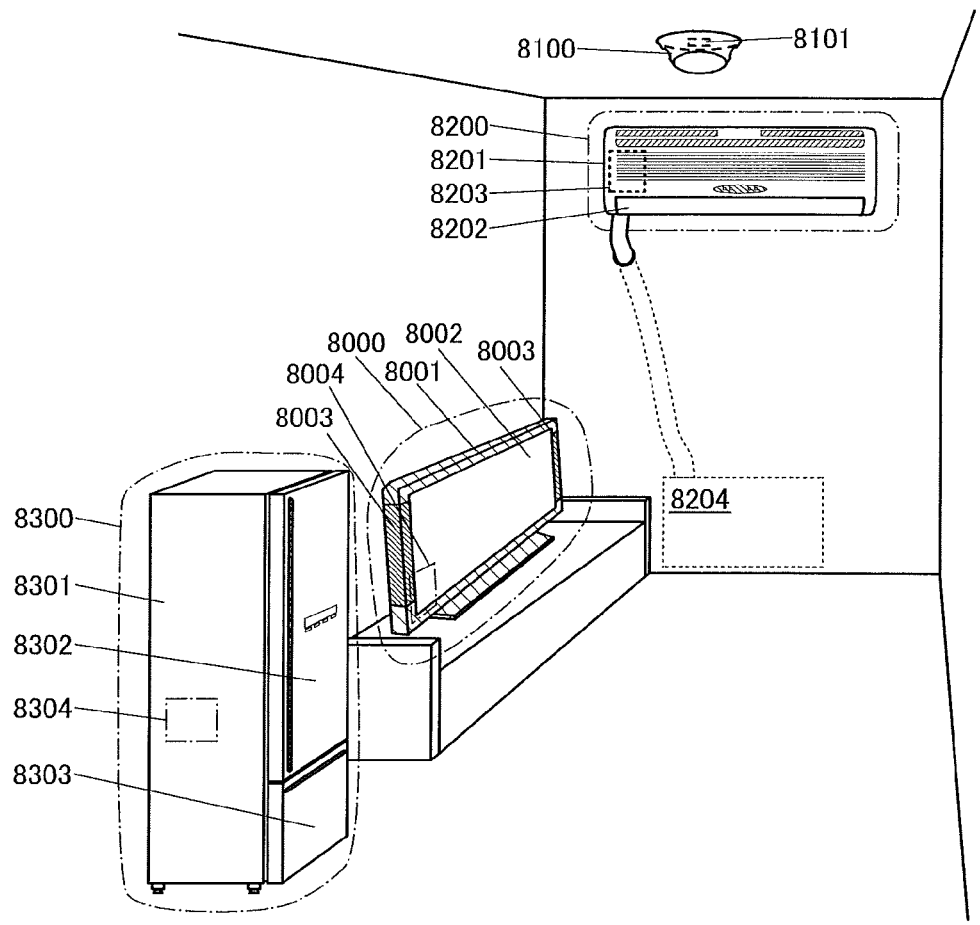
FIGS. 21A to 21C illustrate examples of electric devices.
Figure 21B:
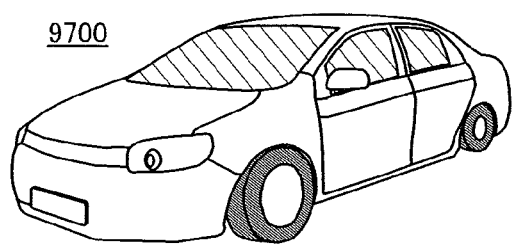
Figure 21C:
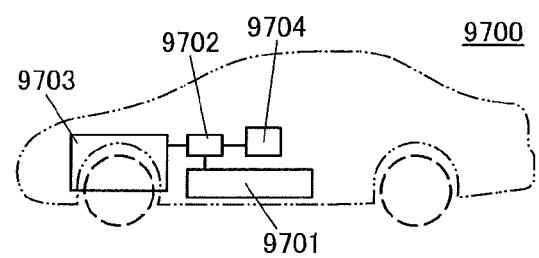

In FIG. 21A, an alarm system 8100 is a residential fire alarm, which includes a sensor portion and an MCU 8101. The transistor described in the above embodiment can be used for the MCU 8101.

In FIG. 21A, a CPU that uses the transistor described in the above embodiment is included in an air conditioner which includes an indoor unit 8200 and an outdoor unit 8204. Specifically, the indoor unit 8200 includes a housing 8201, an air outlet 8202, an MCU 8203, and the like. Although the MCU 8203 is provided in the indoor unit 8200 in FIG. 21A, the MCU 8203 may be provided in the outdoor unit 8204. Alternatively, the MCU 8203 may be provided in both the indoor unit 8200 and the outdoor unit 8204. When the MCU 8203 uses the transistor described in the above embodiment, the power saving of the air conditioner can be achieved.

In FIG. 21A, an MCU that uses the transistor described in the above embodiment is included in an electric refrigerator-freezer 8300. Specifically, the electric refrigerator-freezer 8300 includes a housing 8301, a refrigerator door 8302, a freezer door 8303, an MCU 8304, and the like. The MCU 8304 is provided in the housing 8301 in FIG. 21A. When the MCU 8304 uses the transistor described in the above embodiment, the power saving of the electric refrigerator-freezer 8300 can be achieved.

FIG. 21B illustrates an example of an electric vehicle. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, an MCU, or the like which is not illustrated. When an MCU uses the transistor described in the above embodiment, the power saving of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in combination with any of the other embodiments as appropriate.

This application is based on Japanese Patent Application serial no. 2013-106421 filed with Japan Patent Office on May 20, 2013, the entire contents of which are hereby incorporated by reference.

What is claimed is:

1. A semiconductor device comprising:
   a transistor including:
      a gate electrode over a substrate;
      a second insulating layer over the gate electrode and a first insulating layer, wherein a first portion of the second insulating layer is located in a first trench of the first insulating layer; and
      an oxide semiconductor layer over the second insulating layer, the oxide semiconductor layer including a channel formation region, wherein the oxide semiconductor layer is located in the first trench of the first insulating layer; and
   a capacitor including:
      a first electrode over the first insulating layer and the substrate;
      the second insulating layer over the first electrode, wherein a second portion of the second insulating layer is located in a second trench of the first insulating layer; and
      a second electrode over the second insulating layer,
   wherein the first insulating layer is located over the substrate,
   wherein the first trench overlaps with the gate electrode, and
   wherein the second trench overlaps with the first electrode.

2. The semiconductor device according to claim 1, wherein the first insulating layer is located over the gate electrode.

3. The semiconductor device according to claim 1, wherein the first electrode is located in the second trench.

4. The semiconductor device according to claim 1, further comprising:
   a second oxide semiconductor layer between the second insulating layer and the oxide semiconductor layer, wherein the second oxide semiconductor layer is located in the first trench;
   a source electrode over the second insulating layer, the oxide semiconductor layer, and the second oxide semiconductor layer;
   a drain electrode over the second insulating layer, the oxide semiconductor layer, and the second oxide semiconductor layer; and
   a third oxide semiconductor layer over the oxide semiconductor layer, the source electrode, and the drain electrode,
   wherein the oxide semiconductor layer is in contact with the second oxide semiconductor layer, the third oxide semiconductor layer, the source electrode, and the drain electrode.

5. The semiconductor device according to claim 4, wherein the oxide semiconductor layer, the second oxide semiconductor layer, and the third oxide semiconductor layer each contain one of In, Ga, and Zn.

6. The semiconductor device according to claim 4, wherein the second oxide semiconductor layer and the third oxide semiconductor layer each contain one or more selected from metal elements that constitutes the oxide semiconductor layer.

7. The semiconductor device according to claim 4, wherein electron affinity of the second oxide semiconductor layer and electron affinity of the third oxide semiconductor layer are each smaller than electron affinity of the oxide semiconductor layer.

8. The semiconductor device according to claim 4, further comprising:
   a third insulating layer over the third oxide semiconductor layer;
   a second gate electrode over the third insulating layer; and
   a fourth insulating layer over the second gate electrode,
   wherein part of the fourth insulating layer is in contact with part of the second insulating layer.

9. The semiconductor device according to claim 4, further comprising:
   a third insulating layer over the third oxide semiconductor layer;
   a second gate electrode over the third insulating layer; and
   a fourth insulating layer over the second gate electrode,
   wherein the fourth insulating layer contains aluminum oxide.

10. The semiconductor device according to claim 4, further comprising:
    a third insulating layer over the third oxide semiconductor layer;
    a second gate electrode over the third insulating layer; and
    a fourth insulating layer over the second gate electrode,
    wherein the second insulating layer contains aluminum oxide.

11. A semiconductor device comprising:
    a gate electrode over a substrate;
    a first insulating layer with a first trench and a second trench;
    a first electrode over the first insulating layer and the substrate;
    a second insulating layer over the gate electrode and the first electrode, wherein a first portion of the second insulating layer is located in the first trench and a second portion of the second insulating layer is located in the second trench;
    an oxide semiconductor layer over the second insulating layer, the oxide semiconductor layer including a channel formation region, wherein the oxide semiconductor layer is located in the first trench; and
    a second electrode over the second insulating layer,
    wherein the gate electrode and the channel formation region overlap each other with the second insulating layer interposed therebetween,
    wherein the first electrode and the second electrode overlap each other with the second insulating layer interposed therebetween,
    wherein the first insulating layer is located over the substrate, wherein the first trench overlaps with the gate electrode, and wherein the second trench overlaps with the first electrode.

12. The semiconductor device according to claim 11, wherein the first insulating layer is located over the gate electrode.

13. The semiconductor device according to claim 11, wherein the first electrode is located in the second trench.

14. The semiconductor device according to claim 11, further comprising:
   a second oxide semiconductor layer between the second insulating layer and the oxide semiconductor layer, wherein the second oxide semiconductor layer is located in the first trench;
   a source electrode over the second insulating layer, the oxide semiconductor layer, and the second oxide semiconductor layer;
   a drain electrode over the second insulating layer, the oxide semiconductor layer, and the second oxide semiconductor layer; and
   a third oxide semiconductor layer over the oxide semiconductor layer, the source electrode, and the drain electrode,
   wherein the oxide semiconductor layer is in contact with the second oxide semiconductor layer, the third oxide semiconductor layer, the source electrode, and the drain electrode.

15. The semiconductor device according to claim 14, wherein the oxide semiconductor layer, the second oxide semiconductor layer, and the third oxide semiconductor layer each contain one of In, Ga, and Zn.

16. The semiconductor device according to claim 14, wherein the second oxide semiconductor layer and the third oxide semiconductor layer each contain one or more selected from metal elements that constitutes the oxide semiconductor layer.

17. The semiconductor device according to claim 14, wherein electron affinity of the second oxide semiconductor layer and electron affinity of the third oxide semiconductor layer are each smaller than electron affinity of the oxide semiconductor layer.

18. The semiconductor device according to claim 14, further comprising:
   a third insulating layer over the third oxide semiconductor layer;
   a second gate electrode over the third insulating layer; and
   a fourth insulating layer over the second gate electrode,
   wherein part of the fourth insulating layer is in contact with part of the second insulating layer.

19. The semiconductor device according to claim 14, further comprising:
   a third insulating layer over the third oxide semiconductor layer;
   a second gate electrode over the third insulating layer; and
   a fourth insulating layer over the second gate electrode,
   wherein the fourth insulating layer contains aluminum oxide.

20. The semiconductor device according to claim 14, further comprising:
   a third insulating layer over the third oxide semiconductor layer;
   a second gate electrode over the third insulating layer; and
   a fourth insulating layer over the second gate electrode,
   wherein the second insulating layer contains aluminum oxide.

21. A semiconductor device comprising:
   a transistor including:
      a first portion of an insulating layer, the first portion being located in a first trench of a layer;
      an oxide semiconductor layer located in the first trench, the oxide semiconductor layer comprising a channel formation region; and
      a gate electrode overlapping with the channel formation region and located over a substrate; and
   a capacitor including:
      a first electrode over the layer and the substrate;
      a second electrode; and
      a second portion of the insulating layer, the second portion being located in a second trench of the layer and being located between the first electrode and the second electrode,
   wherein the layer is located over the substrate,
   wherein the first trench overlaps with the gate electrode, and
   wherein the second trench overlaps with the first electrode.

22. The semiconductor device according to claim 21, wherein the oxide semiconductor layer contains In, Ga, and Zn.

* * * * *